United States Patent
Jansen et al.

(10) Patent No.: US 12,018,194 B2
(45) Date of Patent: Jun. 25, 2024

(54) COLOR STABLE Mn-ACTIVATED OXIDOFLUORIDES AS CONVERSION LUMINESCENT MATERIALS FOR LED-BASED SOLID STATE LIGHT SOURCES

(71) Applicants: Seoul Semiconductor Co., ltd., Ansan-si (KR); LITEC-VERMÖGENSVERWALTUNGSGESELLSCHAFT MBH, Greifswald (DE)

(72) Inventors: Thomas Jansen, Muenster (DE); Ho Jun Byun, Ansan-si (KR); Inbeom Song, Ansan-si (KR); Bo Yong Han, Ansan-si (KR); Benjamin Kistner, Greifswald (DE); Stefan Tews, Greifswald (DE)

(73) Assignees: Seoul Semiconductor Co., Ltd., Ansan-si (KR); LITEC-VERMÖGENSVERWALTUNGSGESELLSCHAFT MBH, Greifswald (DE)

( * ) Notice: Subject to any disclaimer, the term of this patent is extended or adjusted under 35 U.S.C. 154(b) by 0 days.

(21) Appl. No.: 17/890,292

(22) Filed: Aug. 18, 2022

(65) Prior Publication Data

US 2023/0083851 A1 Mar. 16, 2023

Related U.S. Application Data

(60) Provisional application No. 63/394,518, filed on Aug. 2, 2022, provisional application No. 63/235,400, filed on Aug. 20, 2021.

(51) Int. Cl.
*C09K 11/57* (2006.01)
*C09K 11/08* (2006.01)
(Continued)

(52) U.S. Cl.
CPC ............. *C09K 11/57* (2013.01); *C09K 11/64* (2013.01)

(58) Field of Classification Search
CPC ....... C09K 11/57; C09K 11/61; C09K 11/613; C09K 11/616; C09K 11/0833;
(Continued)

(56) References Cited

U.S. PATENT DOCUMENTS

| | | | |
|---|---|---|---|
| 8,906,724 B2 | 12/2014 | Murphy et al. | |
| 2014/0327026 A1* | 11/2014 | Murphy | H01L 33/52 252/301.4 F |
| 2018/0149802 A1 | 5/2018 | Krames et al. | |

FOREIGN PATENT DOCUMENTS

| | | |
|---|---|---|
| CN | 106566546 | 4/2017 |
| CN | 111518551 | 8/2020 |
| WO | 2014-152787 | 9/2014 |

OTHER PUBLICATIONS

Jansen et al., "Red-emitting K3HF2WO2F4:Mn4+ for application in warm-white phosphor-converted LEDs—optical properties and magnetic resonance characterization", Royal Society of Chemistry, Dalton Trans., 48, 11 pages. (Year: 2019).*

(Continued)

*Primary Examiner* — Matthew E. Hoban
*Assistant Examiner* — Lynne Edmondson
(74) *Attorney, Agent, or Firm* — Oblon, McClelland, Maier & Neustadt, L.L.P.

(57) ABSTRACT

A compound of the general formula (I): $A_3BF_2M_{1-x}T_xO_{2-2x}F_{4+2x}$ doped with Mn(IV), in which A is selected from the group consisting of Li, Na, K, Rb, Cs, Cu, Ag, Tl, NH4, NR4 and mixtures of two or more thereof, where R is an alkyl or aryl group, B is selected from the group consisting of H and D and mixtures thereof, where D is Deuterium, M is selected from the group consisting of Cr, Mo, W, Te, Re and mixtures of two or more thereof, T is selected from the group (Continued)

consisting of Si, Ge, Sn, Ti, Pb, Ce, Zr, Hf and mixtures of two or more thereof, and $0 \leq x \leq 1$.

18 Claims, 9 Drawing Sheets

(51) Int. Cl.
  *C09K 11/61* (2006.01)
  *C09K 11/64* (2006.01)
  *C09K 11/68* (2006.01)
  *H01L 33/50* (2010.01)
(58) Field of Classification Search
  CPC ............... C09K 11/68; C09K 11/7704; C09K 11/772; C09K 11/681; H01L 33/502; H01L 33/504
  See application file for complete search history.

(56) References Cited

OTHER PUBLICATIONS

International Search Report dated Dec. 2, 2022 in International Application No. PCT/KR2022/012459 (with English Translation).
Zhou, Y. et al., Unveiling Mn4+ substitution in oxyfluoride phosphor Rb2MoO2F4: Mn4+ applied to wide-gamut fast-response backlight displays, Chemical Engineering Journal 415 (2021), 128974.

* cited by examiner

COLOR STABLE Mn-ACTIVATED OXIDOFLUORIDES AS CONVERSION LUMINESCENT MATERIALS FOR LED-BASED SOLID STATE LIGHT SOURCES

CROSS-REFERENCE TO RELATED APPLICATIONS

This application claims priority from and the benefit of United States Provisional Patent Application No. 63/235,400, filed on Aug. 20, 2021, and United States Provisional Patent Application No. 63/394,518, filed on Aug. 2, 2022, each of which is hereby incorporated by reference for all purposes as if fully set forth herein.

TECHNICAL FIELD

Exemplary embodiments of the invention relate generally to Mn (IV) activated luminescent materials, to a process for preparation thereof, and to the use thereof as luminophores or phosphors or conversion luminophores or conversion phosphors, especially in luminophore-converted light-emitting devices, such as pc-LEDs (phosphor converted light emitting diodes). Exemplary embodiments further relate to a radiation converting mixture including the luminescent material according to the exemplary embodiments, and a light source including the luminescent material according to the exemplary embodiments or the radiation converting mixture. Exemplary embodiments further provide a lighting unit including a light source with the luminescent material according to exemplary embodiments or the radiation-converting mixture according to exemplary embodiments. The luminescent materials according to exemplary embodiments are especially suitable for creation of warm white light in LED solid state light sources.

BACKGROUND

For more than 100 years, inorganic luminophores have been developed in order to spectrally adjust emitting display screens, X-ray boosters and radiation or light sources, such that they as far as possible optimally meet the demands of the respective field of use and at the same time consume a minimum amount of energy. In this context, the type of excitation, i.e. the nature of the primary radiation source, and the emission spectrum required are of crucial significance for the selection of the host lattices and the activators.

Particularly for fluorescent light sources for general lighting, i.e., low-pressure discharge lamps and light emitting diodes, novel luminophores are constantly being developed in order to further increase energy efficiency, color rendering, and (color locus) stability.

The above information disclosed in this Background section is only for understanding of the background of the inventive concepts, and, therefore, it may contain information that does not constitute prior art.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

SUMMARY

Figure 1:
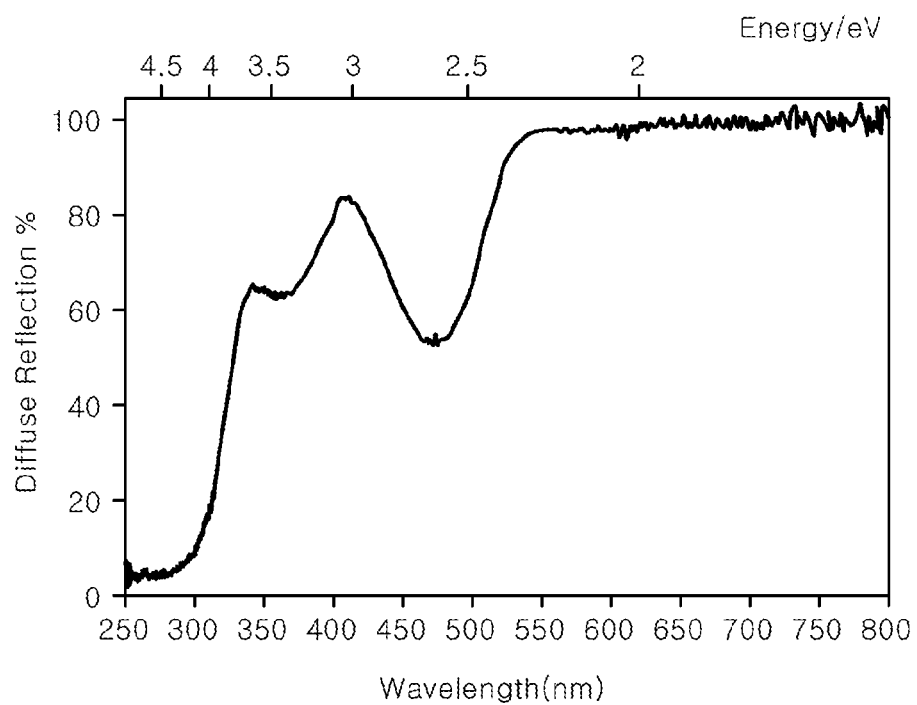
FIG. 1 illustrates Reflection spectrum of $K_3HF_2W_{0.5}Ti_{0.45}Mn_{0.05}F_5O$ (Example 2).
Figure 2:
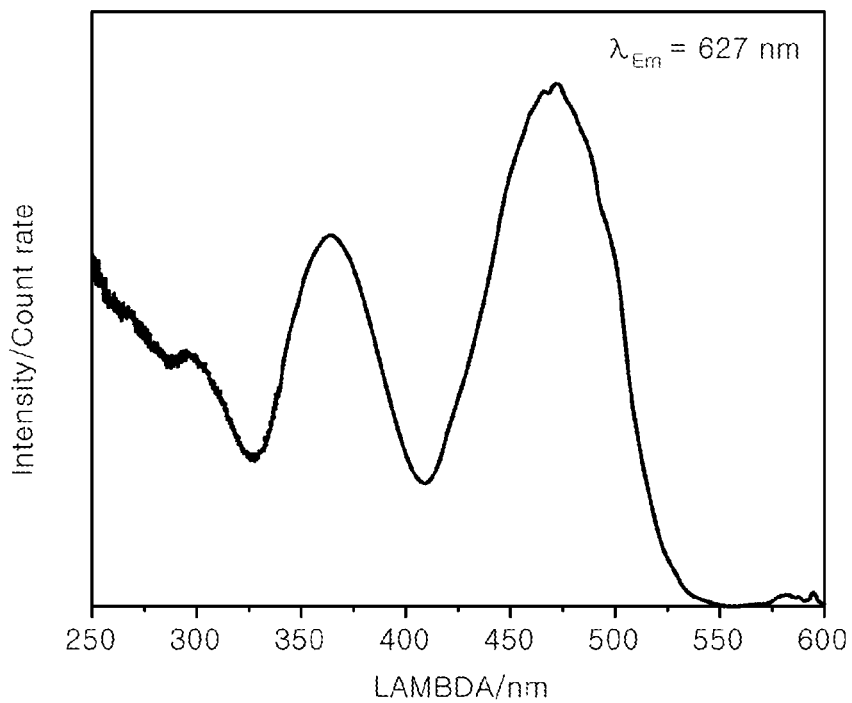
FIG. 2 illustrates Excitation spectrum of $K_3HF_2W_{0.5}Ti_{0.45}Mn_{0.5}F_5O$ (Example 2) ($\lambda em=627$ nm).
Figure 3:
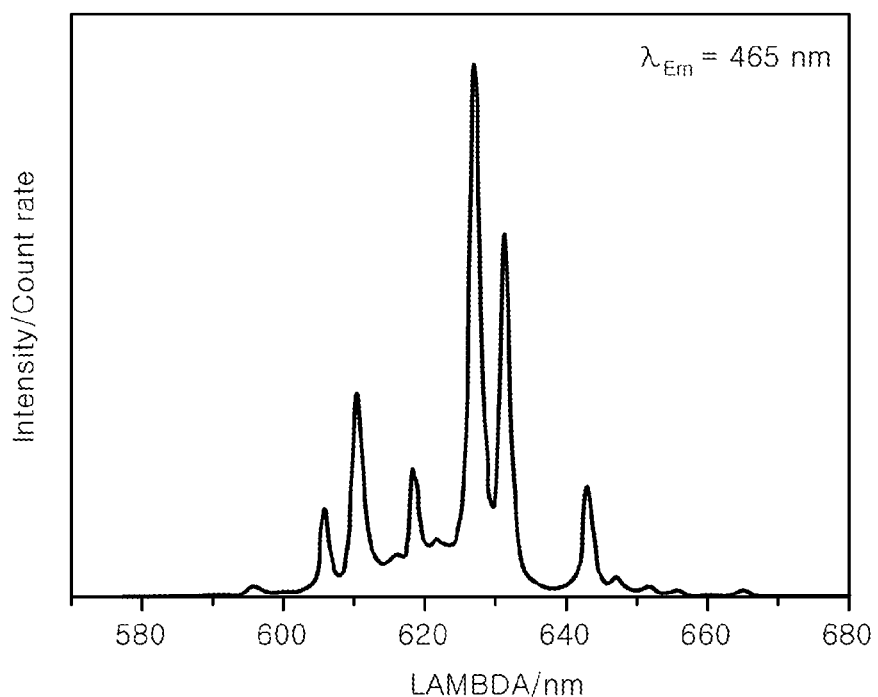
FIG. 3 illustrates Emission spectrum of $K_3HF_2W_{0.5}Ti_{0.45}Mn_{0.05}F_5O$ (Example 2) ($\lambda ex=465$ nm).
Figure 4:
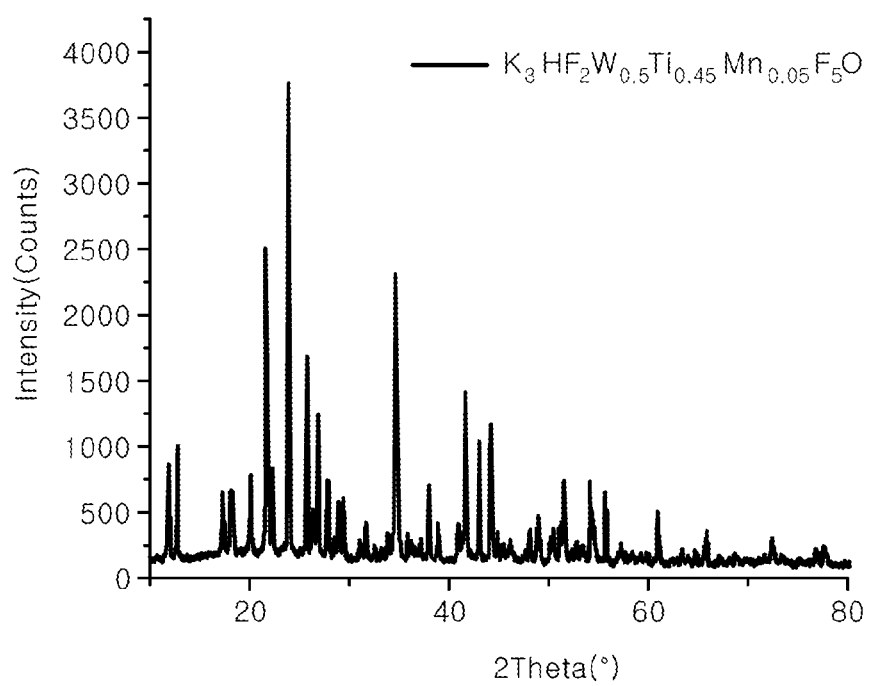
FIG. 4 illustrates an X-ray powder diffractogram of $K_3HF_2W_{0.5}Ti_{0.45}Mn_{0.05}F_5O$ (Example 2).

Luminescent materials according to illustrative implementations of the invention provide prolonged stability, which have intense luminescence in the red spectral region and are especially suitable for use in high-performance pc-LEDs for generation of warm white light, and thus, provide a greater selection of suitable materials for production of white-emitting devices.

One of the problems addressed by exemplary embodiments is thus that of providing novel luminescent materials that feature a broad absorption cross section in the near UV to blue spectral region, have an emission maximum in the red spectral region between 610 and 640 nm, and are thus suitable for use as conversion luminophores in LEDs with high color rendering. Another problem addressed by exemplary embodiments is that of providing luminescent materials with high stability, long lifetime and high light conversion efficiency (quantum efficiency) that are readily obtainable by a simple and inexpensive synthesis. A further problem addressed by exemplary embodiments is that of improving the color rendering index and the stability of the color temperature in an LED. This makes it possible to implement warm white pc-LEDs with high color rendering values at low color temperatures (CCT<4000 K) with simultaneously high light yield.

Additional features of the inventive concepts will be set forth in the description which follows, and in part will be apparent from the description, or may be learned by practice of the inventive concepts.

According to one or more embodiments of the present disclosure, provided is compound of the general formula (I): $A_3BF_2M_{1-x}T_xO_{2-2x}F_{4+2x}$, doped with Mn(IV), where the to symbols and indices used are as follows: A is selected from the group consisting of Li, Na, K, Rb, Cs, Cu, Ag, Tl, $NH_4$, $NR_4$ and mixtures of two or more thereof, where R is an alkyl or aryl group; B is selected from the group consisting of H and D and mixtures thereof, where D is Deuterium; M is selected from the group consisting of Cr, Mo, W, Te, Re and mixtures of two or more thereof; T is selected from the group consisting of Si, Ge, Sn, Ti, Pb, Ce, Zr, Hf and mixtures of two or more thereof; and $0 \leq x \leq 1$.

In another embodiment, the above compound is further represented by the general formula (II): $A_3BF_2M_{1-x}T_xO_{2-2x}F_{4+2x}$:Mn(IV), where the symbols and indices used are as follows: A is selected from the group consisting of Li, Na, K, Rb, Cs, Cu, Ag, Tl, $NH_4$, $NR_4$ and mixtures of two or more thereof, where R is an alkyl or aryl group; B is selected from the group consisting of H and D and mixtures thereof, where D is Deuterium; M is selected from the group consisting of Cr, Mo, W, Te, Re and mixtures of two or more thereof; T is selected from the group consisting of Si, Ge, Sn, Ti, Pb, Ce, Zr, Hf and mixtures of two or more thereof; and $0 < x < 1.0$.

In another embodiment, the index x is: $0.1 \leq m \leq 0.9$, preferably $0.3 \leq m \leq 0.7$ and more preferably $0.55 \leq m \leq 0.65$.

In another embodiment, the compound further includes: (i) A is selected from the group consisting of Na, K, Cs and mixtures of two or three thereof; (ii) B is selected from the group consisting of H and D and mixtures thereof, where D is deuterium; (iii) M is selected from the group consisting of Mo, W and mixtures of Mo and W, where Cr, Te and/or Re may optionally be present; (iv) T is selected from the group consisting of Si, Ti and mixtures of Si and Ti, where Ge, Sn, Pb, Ce, Zr, and/or Hf may optionally be present; and (v) $0.0001 \leq x \leq 0.40$.

In another embodiment, the compound is characterized in that the compound has been coated on its surface with another compound.

According to one or more embodiments of the present disclosure, provided is a process for preparing a compound includes the steps of: a) preparing a solution/suspension including A, B, M, T and Mn in an AF-containing solution; b) stirring the suspension/solution; and c) removing the solid obtained.

According to one or more embodiments of the present disclosure, provided is a luminophore or conversion luminophore allowing partial or complete conversion of UV light, violet light and/or blue light to light of longer wavelength. Said luminophore or conversion luminophore including the compound described above.

In another embodiment, radiation-converting mixture including the compound described above.

In another embodiment, the radiation-converting mixture further includes one or more further luminescent materials selected from conversion luminophores and semiconductor nanoparticles.

In another embodiment, light source includes at least one primary light source and at least one compound described above.

In another embodiment, the at least one primary light source includes a luminescent indium aluminum gallium nitride.

In another embodiment, the luminescent indium aluminum gallium nitride is a compound of the formula $In_iGa_jAl_kN$, where $0 \leq i$, $0 \leq j$, $0 \leq k$ and $i+j+k=1$.

In another embodiment, provided is a lighting unit including at least one light source described above.

A light emitting device according to an embodiment of the present disclosure includes: a substrate; a light emitting diode disposed on the substrate; and a wavelength converter disposed on the light emitting diode, in which the wavelength converter includes a plurality of phosphors, and white light is formed by mixing light emitted from the light emitting diode and each of the plurality of phosphors, and at least one of the plurality of phosphors is an Mn(IV)-activated luminescent material based on an oxidohalide host lattice.

In an embodiment, the at least one of the plurality of phosphors emits light in a same color range as that of the Mn(IV)-activated luminescent material based on the oxidohalide host lattice.

In another embodiment, the at least one of the plurality of phosphors emits light in a different color range from that of the Mn(IV)-activated luminescent material based on the oxidohalide host lattice.

In another embodiment, white light formed by mixing light emitted from the light emitting diode and each of the plurality of phosphors has a CRI of 90 or higher.

In another embodiment, white light formed by mixing light emitted from the light emitting diode and each of the plurality of phosphors has a luminous efficiency exceeding 100%.

In another embodiment, the wavelength converter includes a first wavelength converter and a second wavelength converter, and is stacked on the light emitting diode.

In another embodiment, the wavelength converter may be spaced apart from the light emitting diode and disposed on the light emitting diode.

It is to be understood that both the foregoing general description and the following detailed description are illustrative and explanatory and are intended to provide further explanation of the invention as claimed.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Mn(IV)-activated luminescent materials according to exemplary embodiments, which are based on an oxidohalide host lattice of the general form: $A_3BF2[M_{1-x}T_xO_{2-2x}F_{4+2x}]$ (with A=Li, Na, K, Rb, Cs, Cu, Ag, Tl, NH4, and/or NR4 where R is an alkyl or aryl group; B=H and/or D, where D is Deuterium; M=Cr, Mo, W, Te and/or Re; T=Si, Ge, Sn, Ti, Pb, Ce, Zr and/or Hf; 0≤x≤0.99), address the problems discussed above.

The inventors have found that, surprisingly, red-emitting luminescent materials with emission maxima in the range between 610 and 640 nm, high quantum yield, high color rendering, long lifetime, and high stability of color temperature can be implemented by incorporating Mn(IV) ions into the oxidohalide host lattice of the general form: $A_3BF_2M_{1-x}T_xO_{2-2x}F_{4+2x}$ (with A=Li, Na, K, Rb, Cs, Cu, Ag, Tl, NH4, and/or NR4, where R is an alkyl or aryl group; B=H and/or D, where D is deuterium; M=Cr(VI), Mo(VI), W(VI), Te(VI), and/or Re(VI); T=Si(IV), Ge(IV), Sn(IV), Ti(IV), Pb(IV), Ce(IV), Zr(IV) and/or Hf(VI); 0≤x≤0.99), so as to obtain compounds of the general composition:

$$A_3BF_2M_{1-x}T_xO_{2-2x}F_{4+2x}$$

Furthermore, the luminescent materials are obtainable efficiently and inexpensively by a simple synthesis, particular options being Cr(VI), Mo(VI), W(VI), Te(VI), Re(VI), Si(IV), Ge(IV), Sn(IV), Ti(IV), Pb(IV), Ce(IV) Zr(IV), and/or Hf(IV) in order to obtain fluoride compounds with prolonged stability, since the corresponding octahedral oxidohalide complex anions of the general form $[M_{1-x}T_xO_{2-2x}F_{4+2x}]^2$ have exceptionally high stability. In the case of microscale powders of the luminescent materials according to exemplary embodiments, there is thus no grey discoloration since there is no formation of $MnO_2$. Moreover, the oxidohalides according to exemplary embodiments have greater stability owing to their higher lattice energy compared to other fluorides. An observation made, particularly in the case of tungstates and molybdates, is that significant 7C back-bonding reduces the effective ion charge density on the halide and W(VI) ions.

The tetravalent Mn(IV), Si(IV), Ge(IV), Sn(IV), Ti(IV), Pb(IV), Ce(IV), Zr(IV) and/or Hf(VI) ions are incorporated in the crystallographic layers of the hexavalent M ions (Cr(VI), Mo(VI), W(VI), Te(VI), and/or Re(VI)). Substitution with tetravalent ions permits a simple and efficient synthesis since the tetravalent ions are inserted efficiently into the crystal structure of the host lattice. The charge is balanced by substitution of oxide anions with fluoride anions in the host compound.

Compounds of this general composition are red-emitting Mn(IV) luminescent materials, the emission line multiplet of which in the red spectral region has a maximum between 610 and 640 nm, especially in the range between 620 and 635 nm.

Moreover, the compounds according to exemplary embodiments are suitable for use as conversion lumino- phores in solid-state radiation sources of any kind, for example, solid-state LED light sources or high-performance solid-state LED light sources. The CIE1931 color coordinates for all materials according to exemplary embodiments are x>0.66 and y<0.33, and the lumen equivalent is higher than 200 lm/W, preferably higher than 220 lm/W.

Exemplary embodiments thus provide compounds of the following general formula (I):

$$A_3BF_2M_{1-x}T_xO_{2-2x}F_{4+2x} \qquad (I)$$

doped with Mn(IV), where the symbols and indices used are as follows:
A is selected from the group consisting of A=Li, Na, K, Rb, Cs, Cu, Ag, Tl, NH4, NR4 and mixtures of two or more thereof, where R is an alkyl or aryl group;
B is selected from the group consisting of H and D and mixtures thereof, where D Deuterium;
M is selected from the group consisting of Cr, Mo, W, Te, Re and mixtures of two or more thereof;
T is selected from the group consisting of Si, Ge, Sn, Ti, Pb, Ce, Zr, Hf and mixtures of two or more thereof;

0≤x≤0.99

Preferred alkyl groups are linear C1-05-alkyl radicals or branched C3-C5-alkyl groups. Particularly preferred alkyl groups are methyl, ethyl, propyl, butyl and pentyl.

Preferred aryl groups are phenyl, naphthyl, anthryl and phenanthryl, which may optionally be substituted by one or more groups selected from methyl, ethyl, propyl, butyl, methoxy, ethoxy, hydroxyl, fluoride, chloride and trifluoromethyl.

In the above general formula (I), A is a singly charged metal and/or ammonium cation A+. B is a singly charged hydrogen and/or deuterium cation $B^+$ and M is a hextuply charged metal atom $M^{6+}$. T is present as a quadruply charged metal atom $T^{4+}$, while Fluorine is present as Fluoride ($F^-$) and oxygen O as oxide ($O^{2-}$), Mn is present as a quadruply charged metal atom $Mn^{4+}$. The Mn(IV)-activated luminescent materials according to exemplary embodiments are conversion materials doped with $Mn^{4+}$, where one $Mn^{4+}$ ion and two $F^-$ ions replace one $M^{6+}$ ion and two $O^{2-}$ ions. The charge is thus balanced by the additional incorporation of two ions and the absence of two $0^{2-}$ ions.

The compounds according to exemplary embodiments are typically excitable in the spectral range from about 250 to about 550 nm, preferably from about 325 to about 525 nm, where the absorption maximum is between 425 and 500 nm, and typically emit in the red spectral region from about 600 to about 650 nm, where the emission maximum is in the range between 610 and 640 nm, preferably between 620 and 635 nm. The compounds according to exemplary embodiments additionally show a high photoluminescence quantum yield and have high spectral purity and high stability of color temperature when used in an LED.

As used herein, ultraviolet light refers to light having an emission maximum between 100 and 399 nm, violet light refers to light having an emission maximum between 400 and 430 nm, blue light refers to light having an emission maximum between 431 and 480 nm, cyan light refers to light having an emission maximum between 481 and 510 nm, green light refers to light having an emission maximum between 511 and 565 nm, yellow light refers to light having an emission maximum between 566 and 575 nm, orange light refers to light having an emission maximum between 576 and 600 nm, and red light refers to light having an emission maximum between 601 and 750 nm.

According to an exemplary embodiment, the Mn(IV)-doped compounds of the general formula (I) are represented by the following general formula (II):

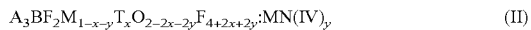

$$A_3BF_2M_{1-x-y}T_xO_{2-2x-2y}F_{4+2x+2y}:MN(IV)_y \quad (II)$$

indices used are as follows:
  A is selected from the group consisting of Li, Na, K, Rb, Cs, Cu, Ag, Tl, NH4, NR4 and mixtures of two or more thereof, where R is an alkyl or aryl group;
  B is selected from the group consisting of H and D and mixtures thereof, where D is deuterium;
  M is selected from the group consisting of Cr, Mo, W, Te, Re and mixtures of two or more thereof;
  T is selected from the group consisting of, Si, Ge, Sn, Ti, Pb, Ce, Zr, Hf and mixtures of two or more thereof; and $0 < x < 1.0$, $0 < y < 1.0$ and $x+y \le 1.0$.

It is preferable that, for the index x in the general formulae (I) and (II): $0 \le x \le 0.99$, and more preferably $0.25 \le x \le 0.75$. In an exemplary embodiment, x in the general formulae (I) and (II) is from 0 to 0.99, and more preferably selected from 0.5, 0.7 and 0.9. Most preferably, in the general formulae (I) and (II): $x=0.9$.

It is preferable that, for the index y in the general formulae (I) and (II): $0.01 \le y \le 0.1$, more preferably $0.05 \le y \le 0.075$, and most preferably $0.035 \le y \le 0.55$. In an exemplary embodiment, y in the general formulae (I) and (II) is 0.04, 0.05 and 0.06. Most preferably, in the general formulae (I) and (II): $y=0.05$.

According to an exemplary embodiment, the index y in the general formulae (II) as follows: $0 < x \le 0.80$, more preferably $0 < x \le 0.60$, even more preferably $0.0001 < x \le 0.40$, especially preferably $0.001 \le x \le 0.20$, more especially preferably $0.001 \le x \le 0.10$, and most preferably $0.002 \le x \le 0.05$.

In an exemplary embodiment, two or more of the above-mentioned preferred features are applicable simultaneously, irrespective of whether they are preferred, more preferred, especially preferred, and/or most preferred features.

Particular preference is therefore given to compounds of the general formulae (II) for which:
  A is selected from the group consisting of Li, Na, K, Rb, Cs, Cu, Ag, Tl, NH4, NR4 and mixtures of two or three thereof;
  B is selected from the group consisting of H and D and mixtures thereof, where D is deuterium;
  M is selected from the group consisting of Mo, W and mixtures of Mo and W, where Cr, Te and/or Re may optionally be present; and $0.0001 \le z \le 0.40$, more preferably $0.001 \le z \le 0.20$, especially preferably $0.001 \le z \le 0.10$, and most preferably $0.002 \le z \le 0.05$.
  T is selected from the group consisting of Si, Ti and mixtures of Si and Ti, where Ge, Sn, Pb, Ce, Zr, and/or Hf may optionally be present; and $0.0001 \le x \le 0.40$, more preferably $0.001 \le x \le 0.20$, especially preferably $0.001 \le x \le 0.10$, and most preferably $0.002 \le x \le 0.05$.

The compound according to exemplary embodiments may preferably have been coated on its surface with another compound as described further below.

Exemplary embodiments further provide a process for preparing a compound of the general formula (I) and/or (II), including the following steps:
  a) preparing a solution/suspension including A, B, M, T and Mn in an AF-containing solution;
  b) stirring the suspension/solution; and
  c) removing the solid obtained.

The solution/suspension is prepared in step a) by suspending/dissolving salts containing B, M, T and Mn in an AF-containing solution. It is possible here to add the salts in step a) either successively in any sequence or simultaneously. The salts may be added either as solids or as suspensions/solutions. The AF-containing solution used is an HF-containing solution and/or a DF-containing solution.

The HF solution used is preferably a concentrated HF solution. Preference is given to using concentrated aqueous HF solution (hydrofluoric acid) with 10-60% by weight of HF, more preferably 20-50% by weight of HF, and most preferably 30-40% by weight of HF in the preparation process according to exemplary embodiments. A DF solution is preferably prepared from $D_2SO_4$ and $CaF_2$. The DF gas obtained is then introduced into $D_2O$, so as to obtain a DF solution.

In the process for preparing a compound of the general formula (I), and/or (II), in step a), salts used as starting compounds for the $A^+$, $M^{6+}$, and $T^{4+}$ ions are preferably halide or oxide compounds, for example $A_2MO_4$, AX and $AHX_2$. Preferred $A_2MO_4$ compounds are: $Li_2CrO_4$, $Na_2CrO_4$, $K_2CrO_4$, $Rb_2CrO_4$, $Cs_2CrO_4$, $Li_2MoO_4$, $Na_2MoO_4$, $K_2MoO_4$, $Rb_2MoO_4$, $Cs_2MoO_4$, $Li_2WO_4$, $Na_2WO_4$, $K_2WO_4$, $Rb_2WO_4$, $Cs_2WO_4$, $Li_2ReO_4$, $Na_2ReO_4$, $K_2ReO_4$, $Rb_2ReO_4$ and $Cs_2ReO_4$. $SiO_2$, $GeO_2$, $SnO_2$, $TiO_2$, $PbO_2$, $CeO_2$, $ZrO_2$, $HfO_2$, $H_2SiF_6$, $H_2GeF_6$, $H_2SnF_6$, $H_2TiF_6$, $H_2PbF_6$, $CeF_4$, $ZrF_4$, $HfF_4$, $Li_2SiF_6$, $Li_2GeF_6$, $Li_2SnF_6$, $Li_2TiF_6$, $Li_2PbF_6$, $Li_2ZrF_6$, $Li_2HfF_6$; $Na_2SiF_6$, $Na_2GeF_6$, $Na_2SnF_6$, $Na_2TiF_6$, $Na_2PbF_6$, $Na_2ZrF_6$, $Na_2HfF_6$, $Rb_2SiF_6$, $Rb_2GeF_6$, $Rb_2SnF_6$, $Rb_2TiF_6$, $Rb_2PbF_6$, $Rb_2ZrF_6$, $Rb_2HfF_6$, $Cs_2SiF_6$, $Cs_2GeF_6$, $Cs_2SnF_6$, $Cs_2TiF_6$, $Cs_2PbF_6$, $Cs_2ZrF_6$, $Cs_2HfF_6$. Preferred fluoride compounds AF are: LiF, NaF, KF, RbF, $NH_4F$, $ND_4F$, CsF. Preferred fluoride compounds $AHF_2$ are: $NaHF_2$, $KHF_2$, $RbHF_2$, $[NH_4]HF_2$, $[ND_4]DF_2$ and $CsHF_2$.

Mn is used in step a) preferably in the form of tetravalent manganese salts as starting compounds, for example $AzMnF6$. Preferred tetravalent manganese salts $A_2MnF6$ are $Li_2MnF_6$, $Na_2MnF_6$, $K_2MnF_6$, $Rb_2MnF_6$, and $Cs_2MnF_6$.

The starting compounds can be suspended/dissolved at temperatures between −10 and 100° C., preferably between 0 and 50° C., more preferably between 10 and 40° C., and most preferably between 15 and 30° C.

The suspension/solution is preferably stirred in step b) at temperatures between −10 and 100° C., preferably between 0 and 50° C., more preferably between 10 and 40° C., and most preferably between 15 and 30° C. for a period of up to 10 h, preferably up to 6 h, more preferably up to 4 h, and most preferably up to 3 h. Preferred periods of time for the stirring of the suspension/solution in step b) are 0.1 to 10 h, 0.5 to 6 h, 1 to 4 h, and 2 to 3 h. In an exemplary embodiment, the suspension/solution is stirred in step b) at a temperature between 15 and 30° C. for 2 to 3 h.

The solids obtained are removed in step c) preferably by filtering, centrifuging or decanting, more preferably by filtering through a suction filter.

In an exemplary embodiment, step c) is followed by a further step d) in which the solids obtained in step c) are washed and dried. The solids are preferably washed with an organic solvent until the solids are acid-free. Preference is given to organic aprotic solvents, for example acetone, hexane, heptane, octane, dimethylformamide (DMF) and dimethyl sulfoxide (DMSO). The solvent used for washing preferably has a temperature of −10 to 20° C.

The solids are dried in step d) preferably under reduced pressure. The drying can be effected at room temperature (20 to 25° C.) or at an elevated temperature, for example 25 to 150° C. After the drying in step d), the desired luminescent material is obtained.

The solids are dried in step d) preferably under reduced pressure. The drying can be effected at room temperature (20 to 25° C.) or at an elevated temperature, for example 25 to 150° C. After the drying in step d), the desired luminescent material is obtained.

Exemplary embodiments still further provide for the use of the luminescent materials according to exemplary embodiments as luminophore or conversion luminophore, especially for partial or complete conversion of UV light, violet light and/or blue light to lower-energy light, i.e., to light of greater wavelength.

The compounds according to exemplary embodiments are therefore also referred to as luminophores.

Exemplary embodiments further provide a radiation-converting mixture including a compound according to exemplary embodiments. The radiation-converting mixture may consist of one or more compounds according to exemplary embodiments, and would thus be equivalent to the above-defined term "luminophore" or "conversion luminophore".

It is preferable that the radiation-converting mixture, as well as one compound according to exemplary embodiments, includes one or more further luminescent materials. Preferred luminescent materials are conversion luminophores other than the compounds described above, or semiconductor nanoparticles (quantum materials).

In an exemplary embodiment, the radiation-converting mixture includes a compound according to exemplary embodiments and a further conversion luminophore. The compound according to exemplary embodiments and the further conversion luminophore may each emit light with mutually complementary wavelengths.

In another exemplary embodiment, the radiation-converting mixture includes a compound according to exemplary embodiments and a quantum material. The compound according to exemplary embodiments and the quantum material may each emit light with mutually complementary wavelengths.

In still another exemplary embodiment, the radiation-converting mixture includes a compound according to exemplary embodiments, a conversion luminophore, and a quantum material.

When the compounds according to exemplary embodiments are used in small amounts, they already give rise to good LED qualities. The LED quality is described by customary parameters, for example the color rendering index (CRI), the correlated color temperature (CCT), lumen equivalents or absolute lumens, or the color locus in CIE x and y coordinates.

The color rendering index (CRI) is a unitless lighting technology parameter that is as well known in the art, and which compares the trueness of color reproduction of an artificial light source with that of sunlight or filament light sources (the latter two have a CRI of 100).

The correlated color temperature (CCT) is a lighting technology parameter that is also well known in the art with the unit of kelvin. The higher the numerical value, the higher the blue component of the light and the colder the white light from a synthetic radiation source appears to the observer. The CCT follows the concept of the blackbody radiator, the color temperature of which is described by what is called the Planck curve in the CIE diagram.

The lumen equivalent is a lighting technology parameter that is also well known in the art with the unit lm/W, which describes the size of the photometric luminous flux in lumen from a light source at a particular radiometric radiation power with the unit of watts. The higher the lumen equivalent, the more efficient a light source.

The luminous flux with the unit lumen is a photometric lighting technology parameter that is well known in the art, which describes the luminous flux from a light source, which is a measure of the total visible radiation emitted by a radiation source. The greater the luminous flux, the brighter the light source appears to the observer.

CIE x and CIE y are the coordinates in the CIE standard color diagram that are well known in the art (1931 Standard Observer here), by which the color of a light source is described.

All the parameters listed above can be calculated by conventional methods from the emission spectra of the light source.

The excitability of the luminophores according to exemplary embodiments extends over a wide range that extends from about 250 to about 550 nm, preferably from about 325 to about 525 nm.

Exemplary embodiments further provide a light source including at least one primary light source and at least one compound according to exemplary embodiments or a radiation-converting mixture according to exemplary embodiments. The emission maximum of the primary light source here is typically in the range from about 250 to about 550 nm, preferably in the range from about 325 to about 525 nm, with conversion of the primary radiation partly or completely to longer-wave radiation by the luminophore of the disclosure.

In a light source according to an exemplary embodiment, the primary light source includes a luminescent indium aluminum gallium nitride, especially of the formula $In_iGa_jAl_kN$ where $0 \leq i$, $0 \leq j$, $0 \leq k$, and $i+j+k=1$.

It is contemplated that possible forms of light sources of this kind are not limited to those described above. These may be light-emitting LED chips of different construction.

In a light source according to another exemplary embodiment, the primary light source is a luminescent arrangement based on ZnO, TCO (transparent conducting oxide), ZnSe or SiC or else an arrangement based on an organic light-emitting layer (OLED).

In a light source according to another exemplary embodiment, the primary light source is a source that exhibits electroluminescence and/or photoluminescence. In addition, the primary light source may also be a plasma source or discharge source.

Corresponding light sources according to exemplary embodiments are also referred to as light-emitting diodes or LEDs.

The luminescent materials according to exemplary embodiments may be used individually or as a mixture with suitable conventional luminescent materials. Corresponding luminescent materials that are suitable in principle for mixtures are conversion luminophores or quantum materials.

Conversion luminophores that can be used together with the luminescent material according to exemplary embodiments and form the radiation-converting mixture according to exemplary embodiments are not subject to any particular restriction. It is therefore generally possible to use any possible conversion luminophore. The following are especially suitable: $Ba_2SiO_4:Eu^{2+}$, $Ba_3SiO_5:Eu^{2+}$, $(Ba,Ca)_3SiO_5:Eu^{2+}$, $BaSi_2N_2O_2:Eu$, $BaSi_2O_5:Pb^{2+}$, $Ba_3Si_6O_{12}N_2:Eu$, $Ba_xSr_{1-x}F_2:Eu^{2+}$ (with $0 \leq x \leq 1$), $BaSrMgSi_2O_7:Eu^{2+}$, $BaTiP_2O_7$, $(Ba,Ti)_2P_2O_7:Ti$, $BaY_2F_8:Er^{3+3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3O_{12}:Ce^{3+}$, Ca3Al2Si3O12:Eu2+, Ca2B5O9Br:Eu2+, Ca2B5O9Cl: Eu2+, Ca2B5O9Cl:Pb2+, CaB2O4:Mn2+, Ca2B2O5: Mn2+, CaB2O4:Pb2+, CaB2P2O9:Eu2+, Ca5B2SiO10: Eu3+, Ca0.5Ba0.5Al12O19:Ce3+, Mn2+, Ca2Ba3(PO4) 3Cl:Eu2+, CaBr2:Eu2+ in SiO2, CaCl2:Eu2+ in SiO2, CaCl2:Eu2+, Mn2+ in SiO2, CaF2:Ce3+, CaF2:Ce3+, Mn2+, CaF2:Ce3+, Tb3+, CaF2:Eu2+, CaF2:Mn2+, CaGa2O4:Mn2+, CaGa4O7:Mn2+, CaGa2S4:Ce3+, CaGa2S4:Eu2+, CaGa2S4:Mn2+, CaGa2S4:Pb2+, CaGeO3:Mn2+, CaI2:Eu2+ in SiO2, CaI2:Eu2+, Mn2+ in SiO2, CaLaBO4:Eu3+, CaLaB3O7:Ce3+, Mn2+, Ca2La2BO6.5:Pb2+, Ca2MgSi2O7, Ca2MgSi2O7:Ce3+, CaMgSi2O6:Eu2+, Ca3MgSi2O8:Eu2+, Ca2MgSi2O7: Eu2+, CaMgSi2O6:Eu2+, Mn2+, Ca2MgSi2O7:Eu2+, Mn2+, CaMoO4, CaMoO4:Eu3+, CaO:Bi3+, CaO:Cd2+, CaO:Cu+, CaO:Eu3+, CaO:Eu3+, Na+, CaO:Mn2+, CaO: Pb2+, CaO:Sb3+, CaO:Sm3+, CaO:Tb3+, CaO:Tl, CaO: Zn2+, Ca2P2O7:Ce3+, α-Ca3(PO4)2:Ce3+, β-Ca3(PO4)2: Ce3+, Ca5(PO4)3Cl:Eu2+, Ca5(PO4)3Cl:Mn2+, Ca5(PO4) 3Cl:Sb3+, Ca5(PO4)3Cl:Sn2+, β-Ca3(PO4)2:Eu2+, Mn2+, Ca5(PO4)3F:Mn2+, Ca5(PO4)3F:Sb3+, Ca5(PO4)3F:Sn2+, α-Ca3(PO4)2:Eu2+, β-Ca3(PO4)2:Eu2+, Ca2P2O7:Eu2+, Ca2P2O7:Eu2+, Mn2+, CaP2O6:Mn2+, α-Ca3(PO4)2: Pb2+, α-Ca3(PO4)2:Sn2+, β-Ca3(PO4)2:Sn2+, β-Ca2P2O7:Sn, Mn, α-Ca3(PO4)2:Tr, CaS:Bi3+, CaS: Bi3+, Na, CaS:Ce3+, CaS:Eu2+, CaS:Cu+, Na+, CaS:La3+, CaS:Mn2+, CaSO4:Bi, CaSO4:Ce3+, CaSO4:Ce3+, Mn2+, CaSO4:Eu2+, CaSO4:Eu2+, Mn2+, CaSO4:Pb2+, CaS: Pb2+, CaS:Pb2+, Cl, CaS:Pb2+, Mn2+, CaS:Pr3+, Pb2+, Cl, CaS:Sb3+, CaS:Sb3+, Na, CaS:Sm3+, CaS:Sn2+, CaS: Sn2+, F, CaS:Tb3+, CaS:Tb3+, Cl, CaS:Y3+, CaS:Yb2+, CaS:Yb2+, Cl, CaSc2O4:Ce, Ca3(Sc,Mg)2Si3O12:Ce,Ca-SiO3:Ce3+, Ca3SiO4Cl2:Eu2+, Ca3SiO4Cl2:Pb2+, CaSiO3:Eu2+, Ca3SiO5:Eu2+, (Ca,Sr)3SO5:Eu2+, (Ca,Sr) 3MgSi2O8:Eu2+, (Ca,Sr)3MgSi2O8:Eu2+, Mn2+, CaSiO3: Mn2+, Pb, CaSiO3:Pb2+, CaSiO3:Pb2+, Mn2+, CaSiO3: Ti4+, CaSr2(PO4)2:Bi3+, β-(Ca,Sr)3(PO4)2:Sn2+Mn2+, CaTi0.9Al0.1O3:Bi3+, CaTiO3:Eu3+, CaTiO3:Pr3+, Ca5 (VO4)3Cl, CaWO4, CaWO4:Pb2+, CaWO4:W, Ca3WO6: U, CaYAlO4:Eu3, CaYBO4:Bi3+, CaYBO4:Eu3+, CaYB0.8O3.7:Eu3+, CaY2ZrO6:Eu3+, (Ca,Zn,Mg)3(PO4) 2:Sn, (Ce,Mg)BaAl11O18:Ce, (Ce,Mg)SrAl11O18:Ce, CeMgAl11O19:Ce:Tb, Cd2B6O11:Mn2+, CdS:Ag+, Cr, CdS:In, CdS:In, CdS:In,Te, CdS:Te, CdWO4, CsF, CsI, CsI:Na+, CsI:Tl, (ErCl3)0.25(BaCl2)0.75, GaN:Zn, Gd3Ga5O12:Cr3+, Gd3Ga5O12:Cr, Ce, GdNbO4:Bi3+, Gd2O2S:Eu3+, Gd2O2Pr3+, Gd2O2S:Pr, Ce, F, Gd2O2S: Tb3+, Gd2SiO5:Ce3+, KAl11O17:Tl+, KGa11O17:Mn2+, K2La2Ti3O10:Eu, KMgF3:Eu2+, KMgF3:Mn2+, K2SiF6: Mn4+, LaAl3B4O12:Eu3+, LaAlB2O6:Eu3+, LaAlO3: Eu3+, LaAlO3:Sm3+, LaAsO4:Eu3+, LaBr3:Ce3+, LaBO3: Eu3+, LaCl3:Ce3+, La2O3:Bi3+, LaOBr:Tb3+, LaOBr: Tm3+, LaOCl:Bi3+, LaOCl:Eu3+, LaOF:Eu3+, La2O3: Eu3+, La2O3:Pr3+, La2O2S:Tb3+, LaPO4:Ce3+, LaPO4: Eu3+, LaSiO3Cl:Ce3+, LaSiO3Cl:Ce3+, Tb3+, LaVO4: Eu3+, La2W3O12:Eu3+, LiAlF4:Mn2+, LiAl5O8:Fe3+, LiAlO2:Fe3+, LiAlO2:Mn2+, LiAl5O8:Mn2+, Li2CaP2O7: Ce3+, Mn2+, LiCeBa4Si4O14:Mn2+, LiCeSrBa3Si4O14: Mn2+, LiInO2:Eu3+, LiInO2:Sm3+, LiLaO2:Eu3+, LuAlO3:Ce3+, (Lu,Gd)2SiO5:Ce3+, Lu2SiO5:Ce3+, Lu2Si2O7:Ce3+, LuTaO4:Nb5+, Lu1-xYxAlO3:Ce3+ (with 0≤x≤1), (Lu,Y)3(Al,Ga,Sc)5O12:Ce,MgAl2O4: Mn2+, MgSrAl10O17:Ce, MgB2O4:Mn2+, MgBa2(PO4)2: Sn2+, MgBa2P2O7:U, MgBaP2O7:Eu2+, MgBaP2O7: Eu2+, Mn2+, MgBa3Si2O8:Eu2+, MgBa(SO4)2:Eu2+, Mg3Ca3(PO4)4:Eu2+, MgCaP2O7: Mn2+, Mg2Ca(SO4)3: Eu2+, Mg2Ca(SO4)3:Eu2+, Mn2, MgCeAlnO19:Tb3+, Mg4(F)GeO6:Mn2+, Mg4(F)(Ge,Sn)O6:Mn2+, MgF2: Mn2+, MgGa2O4:Mn2+, Mg8Ge2O11F2:Mn4+, MgS: Eu2+, MgSiO3:Mn2+, Mg2SiO4:Mn2+, Mg3SiO3F4:Ti4+, MgSO4:Eu2+, MgSO4:Pb2+, MgSrBa2Si2O7:Eu2+, MgSrP2O7: Eu2+, MgSr5(PO4)4:Sn2+, MgSr3Si2O8: Eu2+, Mn2+, Mg2Sr(SO4)3:Eu2+, Mg2TiO4:Mn4+, MgW04, MgYBO4:Eu3+, M2MgSi2O7:Eu2+(M=Ca, Sr, and/or Ba), M2MgSi2O7:Eu2+, Mn2+(M=Ca, Sr, and/or Ba), M2MgSi2O7:Eu2+, Zr4+(M=Ca, Sr, and/or Ba), M2MgSi2O7:Eu2+, Mn2+, Zr4+(M=Ca, Sr, and/or Ba), Na3Ce(PO4)2:Tb3+, Na1.23K0.42Eu0.12TiSi4O11:Eu3+, Na1.23K0.42Eu0.12TiSi5O13.xH2O:Eu3+, Na1.29K0.46Er0.08TiSi4O11:Eu3+, Na2Mg3Al2Si2O10: Tb, Na(Mg2-xMnx)LiSi4O10F2:Mn (with 0≤x≤2), NaYF4: Er3+, Yb3+, NaYO2:Eu3+, P46(70%)+P47 (30%), 6-SiA-lON:Eu, SrAl12O19:Ce3+, Mn2+, SrAl2O4:Eu2+, SrAl4O7:Eu3+, SrAl12O19:Eu2+, SrAl2S4:Eu2+, Sr2B5O9Cl:Eu2+, SrB4O7:Eu2+(F,Cl,Br), SrB4O7:Pb2+, SrB4O7:Pb2+, Mn2+, SrB8O13:Sm2+, SrxBayClAl2O4-z/ 2: Mn2+, Ce3+, SrBaSiO4:Eu2+, (Sr,Ba)3SiO5:Eu,(Sr,Ca) Si2N2O2:Eu, Sr(Cl,Br,I)2:Eu2+ in SiO2, SrCl2:Eu2+in SiO2, Sr5Cl(PO4)3:Eu, SrwFxB4O6.5:Eu2+, SrwFxByOz: Eu2+, Sm2+, SrF2:Eu2+, SrGa12O19:Mn2+, SrGa2S4: Ce3+, SrGa2S4:Eu2+, Sr2-yBaySiO4:Eu (where 0≤y≤2), SrSi2O2N2:Eu, SrGa2S4:Pb2+, SrIn2O4:Pr3+, Al3+, (Sr, Mg)3(PO4)2:Sn, SrMgSi2O6:Eu2+, Sr2MgSi2O7:Eu2+, Sr3MgSi2O8:Eu2+, SrMoO4:U, SrO.3B2O3:Eu2+, Cl, β-SrO·3B2O3:Pb2+, β-SrO.3B2O3:Pb2+, Mn2+, α-SrO.3B2O3:Sm2+, Sr6P5BO20:Eu, Sr5(PO4)3Cl:Eu2+, Sr5(PO4)3Cl:Eu2+, Pr3+, Sr5(PO4)3Cl:Mn2+, Sr5(PO4) 3Cl:Sb3+, Sr2P2O7: Eu2+, β-Sr3(PO4)2:Eu2+, Sr5(PO4) 3F:Mn2+, Sr5(PO4)3F:Sb3+, Sr5(PO4)3F:Sb3+, Mn2+, Sr5 (PO4)3F:Sn2+, Sr2P2O7: Sn2+, ⊖-Sr3(PO4)2:Sn2+, β-Sr3 (PO4)2:Sn2+, Mn2+(Al), SrS:Ce3+, SrS:Eu2+, SrS:Mn2+, SrS:Cu+, Na, SrSO4:Bi, SrSO4:Ce3+, SrSO4:Eu2+, SrSO4: Eu2+, (Sr,Ba)3SiO5:Eu2+, SrTiO3:Pr3+, SrTiO3:Pr3+, Al3+, SrY2O3:Eu3+, ThO2:Eu3+, ThO2:Pr3+, ThO2:Tb3+, YAl3B4O12:Bi3+, YAl3B4O12:Ce3+, YAl3B4O12:Ce3+, Mn, YAl3B4O12:Ce3+, Tb3+, YAl3B4O12:Eu3+, YAl3B4O12:Eu3+, Cr3+, YAl3B4O12:Th4+, Ce3+, Mn2+, YAlO3:Ce3+, Y3Al5O12:Ce3+, Y3Al5O12:Cr3+, YAlO3: Eu3+, Y3Al5O12:Eu3+, Y4Al2O9:Eu3+, Y3Al5O12: Mn4+, YAlO3:Sm3+, YAlO3:Tb3+, Y3Al5O12:Tb3+, YAsO4:Eu3+, YBO3:Ce3+, YBO3:Eu3+, YF3:Er3+, Yb3+, YF3:Mn2+, YF3:Mn2+, Th4+, YF3:Tm3+, Yb3+, (Y,Gd) BO3:Eu, (Y,Gd)BO3:Tb, (Y,Gd)2O3:Eu3+, Y1.34Gd0.60O3:(Eu,Pr), Y2O3:Bi3+, YOBr:Eu3+, Y2O3: Ce, Y2O3:Er3+, Y2O3:Eu3+, Y2O3:Ce3+, Tb3+, YOCl: Ce3+, YOCl:Eu3+, YOF:Eu3+, YOF:Tb3+, Y2O3:Ho3+, Y2O2S:Eu3+, Y2O2S:Pr3+, Y2O2S:Tb3+, Y2O3:Tb3+, YPO4:Ce3+, YPO4:Ce3+, Tb3+, YPO4:Eu3+, YPO4: Mn2+, Th4+, YPO4:V5+, Y(P,V)O4:Eu, Y2SiO5:Ce3+, YTaO4, YTaO4:Nb5+, YVO4:Dy3+, YVO4:Eu3+, ZnAl2O4:Mn2+, ZnB2O4:Mn2+, ZnBa2S3:Mn2+, (Zn,Be) 2SiO4:Mn2+, Zn0.4Cd0.6S:Ag, Zn0.6Cd0.4S:Ag, (Zn,Cd) S:Ag, Cl (Zn,Cd)S:Cu, ZnF2:Mn2+, ZnGa2O4, ZnGa2O4: Mn2+, ZnGa2S4:Mn2+, Zn2GeO4:Mn2+, (Zn,Mg)F2: Mn2+, ZnMg2(PO4)2:Mn2+, (Zn,Mg)3(PO4)2:Mn2+, ZnO:Al3+, Ga3+, ZnO:Bi3+, ZnO:Ga3+, ZnO:Ga, ZnO—CdO:Ga, ZnO:S, ZnO:Se, ZnO:Zn, ZnS:Ag+, Cl−, ZnS:Ag, Cu,Cl, ZnS:Ag,Ni, ZnS:Au, In, ZnS—CdS (25-75), ZnS—CdS (50-50), ZnS—CdS (75-25), ZnS—CdS:Ag,Br,Ni, ZnS—CdS:Ag+, Cl, ZnS—CdS:Cu, Br, ZnS—CdS:Cu, I, ZnS:Cl—, ZnS:Eu2+, ZnS:Cu, ZnS:Cu+, Al3+, ZnS:Cu+, Cl−, ZnS:Cu, Sn, ZnS:Eu2+, ZnS:Mn2+, ZnS:Mn, ZnS:Mn2+, Te2+, ZnS:P, ZnS:P3—,Cl—, ZnS:Pb2+, ZnS: Pb, Cu, Zn3(PO4)2:Mn2+, Zn2SiO4:Mn2+, Zn2SiO4:

$Mn^{2+}$, $As^{5+}$, $Zn_2SiO_4$:Mn,$Sb_2O_2$, $Zn_2SiO_4$:$Mn^{2+}$, P, $Zn_2SiO_4$:$Ti^{4+}$, ZnS:$Sn^{2+}$, ZnS:Sn,Ag, ZnS:Te, Mn, ZnS—ZnTe:$Mn^{2+}$, ZnSe:$Cu^+$, Cl and $ZnWO_4$.

The compounds according to exemplary embodiments especially show advantages when mixed with further luminophores of other fluorescence colors or when used in LEDs together with such luminophores. Preference is given to using the compounds according to exemplary embodiments together with green-emitting luminophores. It has been found that, especially when the compounds according to exemplary embodiments are combined with green-emitting luminophores, the optimization of lighting parameters for white LEDs is possible particularly successfully.

Corresponding green-emitting luminophores are not particularly limited to those described above. Particularly suitable green-emitting luminophores here are (Sr,Ba)$_2SiO_4$:Eu, (Sr,Ba)$_3$ $SiO_5$:Eu, (Sr,Ca)$Si_2N_2O_2$:Eu, $BaSi_2N_2O_2$:Eu, (Lu,Y)$_3$(Al, Ga,Sc)$_5O_{12}$:Ce, SiAlON:Eu, $CaSc_2O_4$:Ce, $CaSc_2O_4$:Ce, Mg, $Ba_3Si_6O_{12}N_2$:Eu and $Ca_3$(Sc,Mg)$_2Si_3O_{12}$:Ce. Particular preference is given to $Ba_3Si_6O_{12}N_2$:Eu and $Ca_3$(Sc,Mg)$_2Si_3O_{12}$:Ce.

In another exemplary embodiment, it is preferable to use the compound of exemplary embodiments as the sole luminophore. The compound according to exemplary embodiments, as a result of the broad emission spectrum with a high red component, shows very good results even when used as a single luminophore.

Quantum materials that can be used together with the luminescent material according to exemplary embodiments and form the radiation-converting mixture according to exemplary embodiments are not subject to any particular restriction. It is therefore generally possible to use any possible quantum material. Suitable quantum materials here are especially semiconductor nanoparticles with elongated, round, elliptical and pyramidal geometry that may be present in a core-shell configuration or in a core-multishell configuration. Semiconductor nanoparticles of this kind are well-known, for example, from WO 2005075339, WO 2006134599, EP 2 528 989 B1, and U.S. Pat. No. 8,062,421 B2, the disclosures of which are hereby incorporated by reference.

The quantum materials preferably consist of semiconductors of groups II-VI, III-V, IV-VI or I-III-VI2 or any combination thereof. For example, the quantum material may be selected from the group consisting of CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, $Cu_2S$, $Cu_2Se$, $CuGaS_2$, $CuGaSe_2$, $CuInS_2$, $CuInSe_2$, $Cu_2$(InGa)$S_4$, $AgInS_2$, $AgInSe_2$, $Cu_2$(ZnSn)$S_4$, alloys thereof and mixtures thereof.

Quantum materials may also be present in the form of semiconductor nanoparticles on the surface of inactivated crystalline materials. In materials of this kind, one or more types of semiconductor nanoparticles are present on the surface of one or more kinds of inactivated crystalline materials, for example, inactivated luminophore matrix materials. Materials of this kind are also referred to as quantum material on a phosphor matrix (QMOP) and are known from WO 2017/041875 A1, the disclosure of which is hereby incorporated by reference.

In yet another exemplary embodiment, it is preferable when the luminophores are arranged on the primary light source such that the red-emitting luminophore is essentially irradiated by the light from the primary light source, while the green-emitting luminophore is essentially irradiated by the light that has already passed through the red-emitting luminophore or has been scattered thereby. This can be achieved in that the red-emitting luminophore is mounted between the primary light source and the green-emitting luminophore.

The luminophores or luminophore combinations according to exemplary embodiments may be in the form of bulk material, powder material, thick or thin sheet material or self-supporting material, preferably in the form of a film. In addition, it can also be embedded in an encapsulation material.

The luminophores or luminophore combinations according to exemplary embodiments may either be dispersed here in an encapsulation material or, given suitable size ratios, may be arranged directly atop the primary light source or else arranged at a distance therefrom, according to the application (the latter arrangement also includes "remote phosphor technology"). The advantages of remote phosphor technology are well-known in the art, for example, in the following publication: Japanese Journal of Applied Physics Vol. 44, No. 21 (2005), L649-L651.

The term "encapsulation material" relates to a transparent matrix material that encapsulates the luminescent materials and radiation-converting mixtures according to exemplary embodiments. The transparent matrix material may be formed from a silicone, a polymer (formed from a liquid or semisolid precursor material, such as a monomer or oligomer), an epoxide, a glass or a hybrid of a silicone and an epoxide. Specific but nonlimiting examples of the polymers include fluorinated polymers, polyacrylamide polymers, polyacrylic acid polymers, polyacrylonitrile polymers, polyaniline polymers, polybenzophenone polymers, poly(methyl methacrylate) polymers, silicone polymers, aluminum polymers, polybisphenol polymers, polybutadiene polymers, polydimethylsiloxane polymers, polyethylene polymers, polyisobutylene polymers, polypropylene polymers, polystyrene polymers, polyvinyl polymers, polyvinyl butyral polymers or perfluorocyclobutyl polymers. Silicones may include gels, for example Dow Corning® OE-6450, elastomers, for example Dow Corning® OE-6520, Dow Corning® OE-6550, Dow Corning® OE-6630, and resins, for example Dow Corning® OE-6635, Dow Corning® OE-6665, Nusil LS-6143 and other products from Nusil, Momentive RTV615, Momentive RTV656 and many other products from other manufacturers. In addition, the encapsulation material may be a (poly)silazane, for example a modified organic polysilazane (MOPS) or a perhydropolysilazane (PHPS). The proportion of luminescent material or of the radiation-converting mixture, based on the encapsulation material, is preferably in the range from 1% to 300% by weight, more preferably in the range from 3% to 50% by weight.

In a further exemplary embodiment, it is preferable when the optical coupling between the luminescent material and the primary light source is achieved by means of a light-guiding arrangement. It is thus possible to install the primary light source at a central site and to optically couple it to the luminescent material by means of light-guiding devices, for example optical fibers. In this way, it is possible to position an intense primary light source at a site favorable for electrical installation and, without further electrical cabling, but merely by positioning optical fibers, to install lighting composed of luminescent materials optically coupled to the optical fibers at any desired sites.

Furthermore, the luminophore according to exemplary embodiments or the radiation-converting mixture according to exemplary embodiments may be used in a filament LED as described, for example, in US 2014/0369036 A1.

Exemplary embodiments further provide a lighting unit, especially for backlighting of display devices, characterized in that it includes at least one light source according to exemplary embodiments, and a display device, especially liquid-crystal display device (LC display), having backlighting, characterized in that it includes at least one lighting unit according to exemplary embodiments.

The average particle size of the luminophores according to exemplary embodiments for use in LEDs is typically between 50 nm and 30 µm, preferably between 0.1 µm and 25 µm, and more preferably between 1 µm and 20 µm. The average particle size is preferably ascertained according to ISO 13320:2009 ("Particle size analysis laser diffraction methods"). The ISO standard is based on the measurement of the size distribution of particles by analysis of their light scattering properties.

For use in LEDs, the luminophores can also be converted to any desired external forms, such as spherical particles, platelets and structured materials and ceramics. These forms are encompassed in accordance with the disclosure by the term "shaped bodies". Preferably, the shaped body is a "luminophore body". Exemplary embodiments thus further provide a shaped body including the luminophores according to exemplary embodiments. The production and use of corresponding shaped bodies is well-known in the art from numerous publications.

The compounds according to exemplary embodiments have the following advantageous properties:
1) The compounds according to exemplary embodiments have an emission spectrum with a high red component and have a high photoluminescence quantum yield.
2) The compounds according to exemplary embodiments have low thermal quenching. For instance, the TQ1/2 values of the compounds according to exemplary embodiments are typically in the region above 400 K.
3) The high thermal stability of the compounds according to exemplary embodiments enables the use of the material in light sources under high thermal stress as well.
4) Moreover, the compounds according to exemplary embodiments feature a long lifetime and enable high color rendering and high stability of the color temperature in an LED. This makes it possible to implement warm white pc-LEDs with high color rendering values at low color temperatures (CCT<4000 K).
5) The compounds according to exemplary embodiments can be prepared efficiently and inexpensively via a simple synthesis.

All the exemplary embodiments described here can be combined with one another unless the respective exemplary embodiments are mutually exclusive.

The examples which follow are intended to illustrate the exemplary embodiments and, in particular, show the result of illustrative combinations of the exemplary embodiments. However, they should in no way be considered to be limiting; instead, they are supposed to encourage generalization. All compounds or components that are used in the preparation are either known and commercially available or can be synthesized by known methods. The temperatures reported in the examples are always in ° C. unless indicated otherwise. It will also be self-evident that, both in the description and the examples, the amounts of the constituents used in the compositions will always add up to a total of 100%. Percentages should always be seen within the given context.

EXAMPLES AND TEST METHODS

The emission spectra were recorded with a fluorescence spectrometer from Edinburgh Instruments Ltd., equipped with mirror optics for powder samples, at an excitation wavelength of 450 nm. The excitation source used was a 450 W Xe lamp. For temperature-dependent measurement of emission, the spectrometer was equipped with a cryostat from Oxford Instruments (MicrostatN2). The coolant used was nitrogen.

Reflection spectra were determined with a fluorescence spectrometer from Edinburgh Instruments Ltd. For this purpose, the samples were positioned in a BaSO4-coated Ulbricht sphere and analyzed. Reflection spectra were recorded within a range from 250 to 800 nm. The white standard used was BaSO4 (Alfa Aesar 99.998%). A 450 W high-pressure Xe lamp served as excitation source.

The excitation spectra were recorded with a fluorescence spectrometer from Edinburgh Instruments Ltd., equipped with mirror optics for powder samples, at 550 nm. The excitation source used was a 450 W Xe lamp.

The x-ray diffractograms were recorded with a Rigaku Miniflex II, operated in Bregg-Brentano geometry, in 0.02° steps with an integration time of 1 s with Cu Kalpha radiation.

The crystal structure analysis was conducted as follows: needle-shaped single crystals were isolated. The crystals were stuck to thin quartz fibers with beeswax. The quality of the single crystals for the intensity data collection was verified by Laue images with a Buerger camera (white molybdenum x-radiation, image plate technique, Fujifilm, BAS-1800). The datasets were measured on a diffractometer from Stoe StadiVari, which was equipped with an Mo microfocus source and a Pilatus detection system at 293 K. The temperature was controlled using a Cryostream Plus System (Oxford Cryosystems, 700 series) with an accuracy of ±0.5 K. On the basis of a Gaussian profile of the x-ray source, the scaling was conducted with a numerical absorption correction for all datasets.

Example 1

Figure 5:
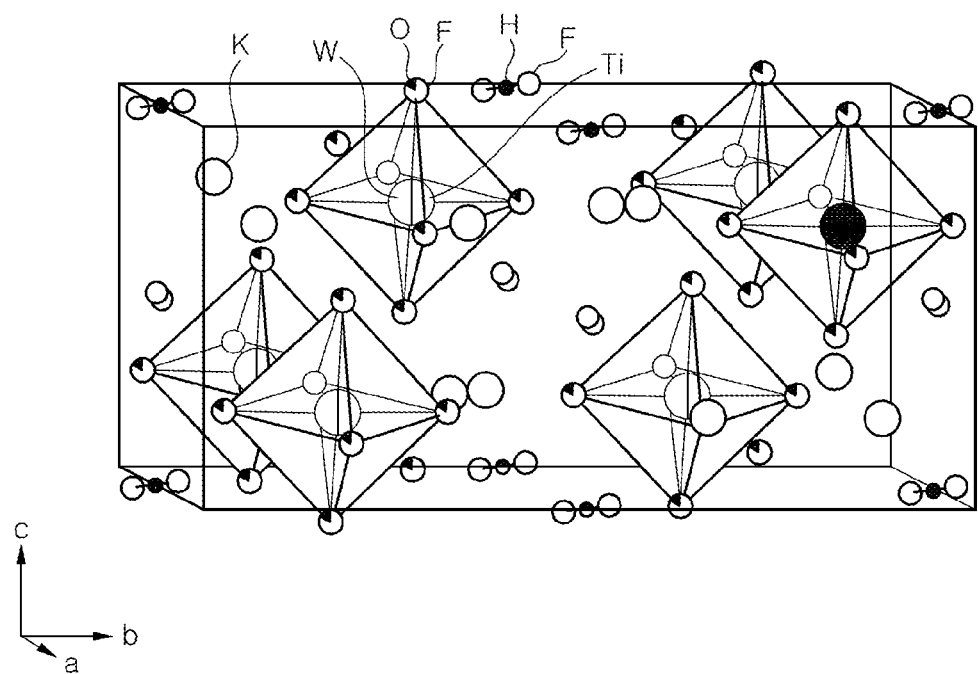
FIG. 5 illustrates representation of the crystal structure of $K_3HF_2W_{0.5}Ti_{0.45}Mn_{0.05}F_5O$ (Example 2).

Preparation of $K_3HF_2Mo_{0.5}Ti_{0.45}Mn_{0.05}F_5O$ 6.69 g (120 mmol) of KF, 1.19 g (5.00 mmol) of K2MoO4, 0.36 g (4.5 mmol) of TiO2, and 0.1234 g (0.5 mmol) of K2MnF6 were each dissolved in 3 ml of hydrofluoric acid (48% by weight). With vigorous stirring, the KF solution was first combined with the K2MnF6 solution. Thereafter, the $K_2MoO_4$ solution and $TiO_2$ solution were slowly added dropwise. There was instantaneous formation of a yellow precipitate that conforms to the composition $K_3HF_2Mo_{0.5}Ti_{0.45}Mn_{0.05}F_5O$. The powder was filtered off and then washed repeatedly with cold acetone (about 0° C.). The pale yellow powder obtained was dried at 80° C. for 8 h. The CIE1931 color locus is at x=0.688 and y=0.312. The lumen equivalent is 231 lm/Wopt. FIG. 5 shows an x-ray powder diffractogram of the compound prepared.

Example 2

Figure 6:
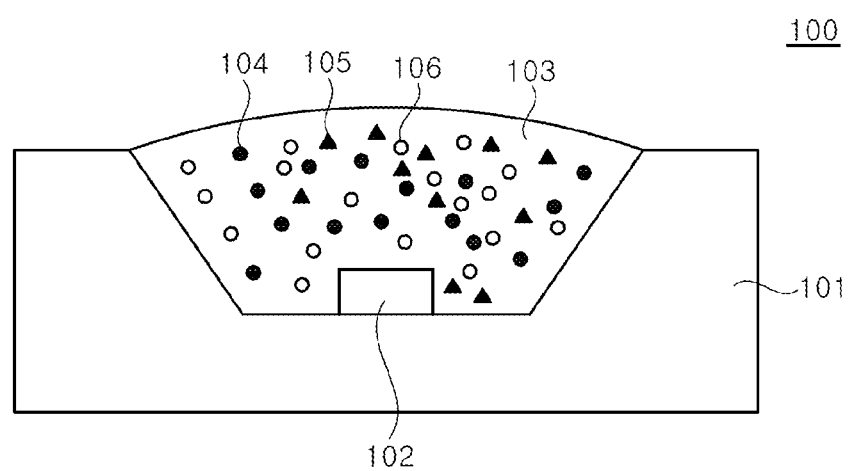
FIG. 6 is a schematic cross-sectional view illustrating a light emitting device according to an exemplary embodiment.
Figure 7:
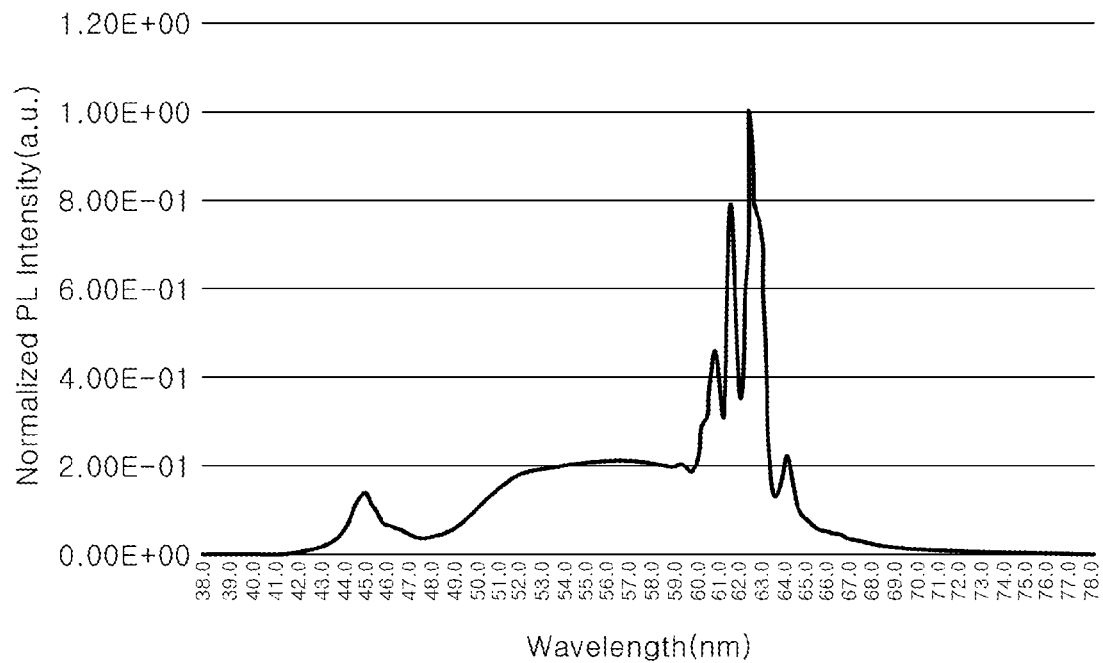
FIG. 7 is a graph showing a spectrum of light emitted from the light emitting device according to an exemplary embodiment.

Preparation of $K_3HF_2W_{0.5}Ti_{0.45}Mn_{0.05}F_5O$ 6.69 g (120 mmol) of KF, 1.63 g (5 mmol) of $K_2WO_4$, 0.36 g (4.5 mmol) of TiO2, and 0.1234 g (0.5 mmol) of $K_2MnF_6$ were each dissolved in 3 ml of hydrofluoric acid (48% by weight). With vigorous stirring, the KF solution was first combined with the K2MnF6 solution. Thereafter, the $K_2WO_4$ solution and $TiO_2$ solution were slowly added dropwise. There was instantaneous formation of a yellow precipitate that conforms to the composition $K_3HF_2W_{0.5}Ti_{0.45}Mn_{0.05}F_5O$. The powder was filtered off and then washed repeatedly with cold acetone (about 0° C.). The pale yellow powder obtained was dried at 80° C. for 8 h. The CIE1931 color locus is at x=0.688 and y=0.312. The lumen equivalent is 225 lm/Wopt. The reflection spectrum, excitation spectrum, emission spectrum and thermal quenching curve of the compound prepared are shown in FIGS. 1 to 4. FIGS. 6 and 7 show an x-ray powder diffractogram and a representation of the crystal structure of the compound prepared.

Example 3

Preparation of $K_3HF_2W_{0.5}Si_{0.45}Mn_{0.05}F_5O$ 6.69 g (120 mmol) of KF, 1.63 g (5 mmol) of $K_2WO_4$, 0.27 g (4.5 mmol) of $SiO_2$, and 0.1234 g (0.5 mmol) of $K_2MnF_6$ were each dissolved in 3 ml of hydrofluoric acid (48% by weight). With vigorous stirring, the KF solution was first combined with the K2MnF6 solution. Thereafter, the $K_2WO_4$ solution and $TiO_2$ solution were slowly added dropwise. There was instantaneous formation of a yellow precipitate that conforms to the composition $K_3HF_2W_{0.5}Ti_{0.45}Mn_{0.05}F_5O$. The powder was filtered off and then washed repeatedly with cold acetone (about 0° C.). The pale yellow powder obtained was dried at 80° C. for 8 h. The CIE1931 color locus is at x=0.688 and y=0.312. The lumen equivalent is 225 lm/Wopt.

FIG. 6 is a schematic cross-sectional view illustrating a light emitting device 100 according to an exemplary embodiment. Referring to FIG. 6, the light emitting device 100 includes a housing 101, a light emitting diode 102, and a wavelength converter 103. The wavelength converter 103 may include a plurality of phosphors 104, 105, and 106. In FIG. 6, the wavelength converter 103 is illustrated as including a first phosphor 104, a second phosphor 105, and a third phosphor 106, but the number of phosphors is not limited thereto.

The housing 101 may have an inner wall forming a cavity, and the light emitting diode 102, the first phosphor 104, the second phosphor 105, the third phosphor 106, and the wavelength converter 103 may be disposed in the cavity of the housing 101. The inner wall of the housing 101 may be formed to be inclined so as to reflect light emitted from the light emitting diode 102.

The light emitting diode 102 may be disposed on a bottom surface of the housing 101, and lead terminals for electrical connection to the light emitting diode 102 may be disposed on the housing 101. The wavelength converter 103 may include the first, second, and third phosphors 104, 105, and 106, and may cover the light emitting diode 102.

The light emitting diode 102 may be an ultraviolet light emitting diode or a blue light emitting diode. When the light emitting diode 102 is the blue light emitting diode, a peak wavelength of light emitted may be located within a range of 410 nm to 490 nm. A full width at half maximum (FWHM) of an emission spectrum of the blue light emitted from the light emitting diode 102 may be less than or equal to 30 nm. Although the light emitting device 100 is exemplary illustrated as including one light emitting diode 102, the inventive concepts are not limited to a particular number and an arrangement form of the arranged light emitting diodes 102. For example, in some exemplary embodiments, a plurality of light emitting diodes 102 may be disposed. When the plurality of light emitting diodes 102 is disposed, the plurality of light emitting diodes 102 may emit light having different peak wavelengths from one another. The plurality of light emitting diodes 102 may emit light having emission spectra having different full widths at half maximum. A difference in full widths at half maximum between the emission spectra of the plurality of light emitting diodes 102 may be 10 nm or less. The plurality of light emitting diodes 102 may emit light of different wavelength bands from one another. For example, one light emitting diode may emit ultraviolet light and another light emitting diode may emit blue light. In an exemplary embodiment, one light emitting diode may emit ultraviolet light or short wavelength blue light within a range of 390 nm to 430 nm, and another light emitting diode may emit blue light within a range of 430 nm to 470 nm. In another exemplary embodiment, at least two light emitting diodes of the plurality of light emitting diodes 102 may emit ultraviolet light or short wavelength blue light within the range of 390 to 430 nm, or blue light within the range of 430 nm to 470 nm.

The wavelength converter 103 may be formed of a material having a high hardness. Specifically, the wavelength converter 103 may be formed of a material including at least one of silicone, epoxy, polymethyl methacrylate (PMMA), polyethylene (PE), and polystyrene (PS) so as to have the high hardness.

The plurality of phosphors 104, 105, and 106 included in the wavelength converter 103 may be excited by light of the light emitting diode 102 to emit light of a wavelength band different from that of the light emitting diode 102. Peak wavelengths of light emitted from the plurality of phosphors 104, 105, and 106 may be different from one another. In an exemplary embodiment, the peak wavelengths of light emitted from the plurality of phosphors 104, 105, and 106 are different from one another, but at least two kinds of phosphors among them may have peak wavelengths in same color ranges. Full widths at half maximum of light emitted from the plurality of phosphors may be different from one another. For example, a full width at half maximum of light emitted from the first phosphor 104 may be greater than that of light emitted from the second phosphor 105, and a full width at half maximum of light emitted from the second phosphor 105 may be greater than that of light emitted from the third phosphor 106.

The first phosphor 104 may be excited by light of the light emitting diode 102 to emit green light. The second phosphor 105 and the third phosphor 106 may be excited by light of the light emitting diode to emit red light. Alternatively, the first phosphor 104 and the second phosphor 105 may be excited by light of the light emitting diode 102 to emit green light, and the third phosphor 106 may be excited by light of the light emitting diode to emit red light.

A peak wavelength of green light emitted from the first phosphor 104 may be located within a range of 500 nm to 600 nm. The first phosphor 104 may include at least one of phosphors selected from a BAM (Ba—Al—Mg)-based phosphor, a quantum dot phosphor, a silicate-based phosphor, a beta-SiAlON-based phosphor, a Garnet-based phosphor, a LSN-based phosphor, and a fluoride-based phosphor. The first phosphor 104 dispersed in the wavelength converter 103 may include a phosphor having a particle size of 10 μm or more and 50 μm or less.

The second phosphor 105 may be excited by light of the light emitting diode 102 to emit red light. A peak wavelength of red light emitted from the second phosphor 105 may be located within a range of 600 nm to 670 nm. The second phosphor 105 may be a nitride-based phosphor represented by CASN, CASON, and SCASN, but the inventive concepts are not limited thereto. In addition, the second phosphor 105 may include at least one of a quantum dot phosphor and a sulfide-based phosphor. The second phosphor 105 dispersed in the wavelength converter 103 may include a phosphor having a particle size of 5 μm or more and 30 μm or less.

The third phosphor 106 may be excited by light of the light emitting diode 102 to emit red light. A peak wavelength of red light emitted from the third phosphor 106 may be different from that of red light emitted from the second phosphor 105. The peak wavelength of red light emitted from the third phosphor 106 may be located within a range of 600 nm to 670 nm. The third phosphor may be an Mn(IV)-activated luminescent material based on an oxidohalide host lattice disclosed in Experimental Examples 1 to 3 described above.

The third phosphor 106 dispersed in the wavelength converter 103 may include a phosphor having a particle size of 20 μm or more and 55 μm or less. Referring to FIG. 6, a light emitting device including a blue light emitting diode emitting light of a peak wavelength of about 450 nm, a garnet-based green phosphor, a nitride-based red phosphor, and an Mn(IV)-is activated red phosphor based on an oxidohalide host lattice in the housing 101 was manufactured, and color coordinates (CIE), CRI, R9 and Flux (lm (%)) were measured, which is shown in Table 1 below, and FIG. 7 shows spectra of light emitted from the light emitting device.

In addition, for comparison with the light emitting device according to an exemplary embodiment, a light emitting device was manufactured in a same manner as the light emitting device according to the exemplary embodiment except that a third phosphor includes a nitride-based phosphor different from that of a second phosphor, and color coordinates (CIE), CRI, R9 and Flux (lm (%)) were measured, which is shown in Table 1 below.

TABLE 1

| Classification | CIE-x | CIE-y | CRI | R9 | lm(%) |
|---|---|---|---|---|---|
| Experimental Example | 0.4688 | 0.417 | 93.9 | 79.4 | 115% |
| Comparative Example | 0.468 | 0.418 | 90 | 50 | 100% |

As shown in Table 1, it can be seen that the light emitting device manufactured according to an exemplary embodiment maintains desired color coordinates to emit white light having a CRI of 93 or more, and shows a light flux as high as 115% compared to the comparative example. As such, the light emitting device manufactured according to an exemplary embodiment has a higher color rendering than that of the comparative example, and emit white light with a large amount of flux at the same time.

Referring to FIG. 7, white light according to an exemplary embodiment may have respective peak wavelengths in different color regions from one another. In addition, white light according to exemplary embodiments may have a plurality of peak wavelengths in one color region. For example, white light may have a plurality of peak wavelengths in a red region. The plurality of peak wavelengths in the red region may have narrower full widths at half maximum than a peak wavelength in a green region. The plurality of peak wavelengths in the red region may include two or more peak wavelengths, and further may include four or more peak wavelengths. The plurality of peak wavelengths in the red region may include a first peak wavelength between 610 nm and 640 nm and a second peak wavelength between 630 nm and 650 nm. An emission spectrum having the first peak wavelength and an emission spectrum having the second peak wavelength may have a full width at half maximum of 20 nm or less, respectively. Furthermore, the emission spectrum having the first peak wavelength and the emission spectrum having the second peak wavelength may have a full width at half maximum of 15 nm or less. The first peak wavelength may have a plurality of first sub-peak wavelengths. An intensity of light having the first peak wavelength may be higher than that of light having the second peak wavelength. In addition, an intensity of light having at least one first sub-peak of the plurality of first sub-peak wavelengths may be higher than that of light having the second peak wavelength. An intensity of light having the plurality of first sub-peak wavelengths may be higher than that of light having the second peak wavelength.

Figure 8A:
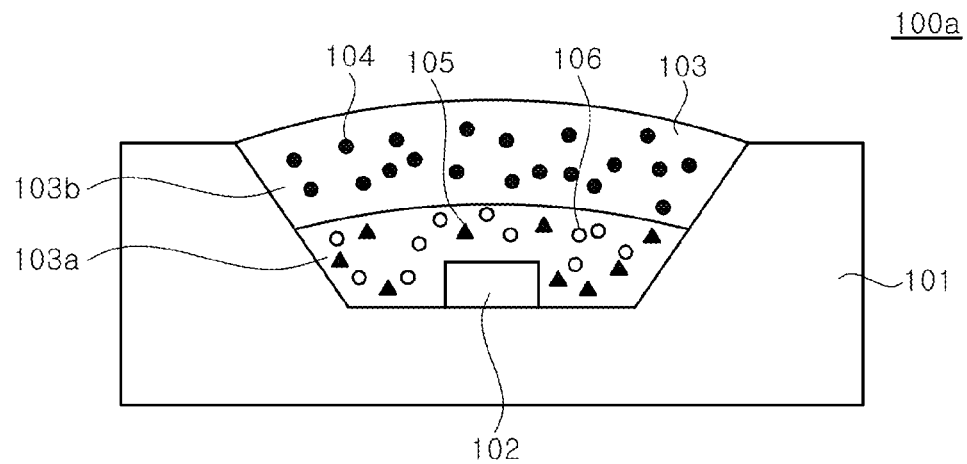
FIG. 8A is a schematic cross-sectional view illustrating a light emitting device according to another exemplary embodiment.

FIG. 8A is a schematic cross-sectional view illustrating a light emitting device 100a according to another exemplary embodiment.

Referring to 8A, the light emitting device 100a includes a housing 101, a light emitting diode 102, and a wavelength converter 103, in which the wavelength converter 103 includes a plurality of phosphors 104, 105, and 106. The light emitting device according to the illustrated exemplary embodiment is substantially similar to the light emitting device according to FIG. 6 except for the wavelength converter 103, and thus, repeated descriptions of the same components will be omitted.

In the illustrated exemplary embodiment, the wavelength converter 103 may include a first wavelength converter 103a and a second wavelength converter 103b. The first wavelength converter 103a and the second wavelength converter 103b may cover the light emitting diode 102, and the second wavelength converter 103b may cover the first wavelength converter 103a. The first wavelength converter 103a may be formed of a material having a same hardness as that of the second wavelength converter 103b, or may be formed of a material having a different hardness.

In an exemplary embodiment, the first wavelength converter 103a may include the phosphors 105 and 106 emitting red light, and the second wavelength converter 103b may include the phosphor 104 emitting green light. By disposing the second and third phosphors 105 and 106 emitting light of a relatively longer wavelength in a lower region, and disposing the first phosphor 104 emitting light of a relatively shorter wavelength in an upper region, it is possible to prevent green light emitted from the first phosphor 104 from being absorbed and lost by the second or third phosphors 105 and 106.

In another exemplary embodiment, the first wavelength converter 103a may include the phosphor 104 emitting green light, and the second wavelength converter 103b may include the phosphors 105 and 106 emitting red light. In this case, at least one of the plurality of phosphors emitting red light may have a low excitation efficiency by green light. Accordingly, even when the first phosphor 104 emitting green light is disposed in the lower region, it is possible to improve a stability of the red phosphor, which is vulnerable to heat, while preventing green light from being absorbed by the red phosphor 105 or 106 and lost.

Figure 8B:
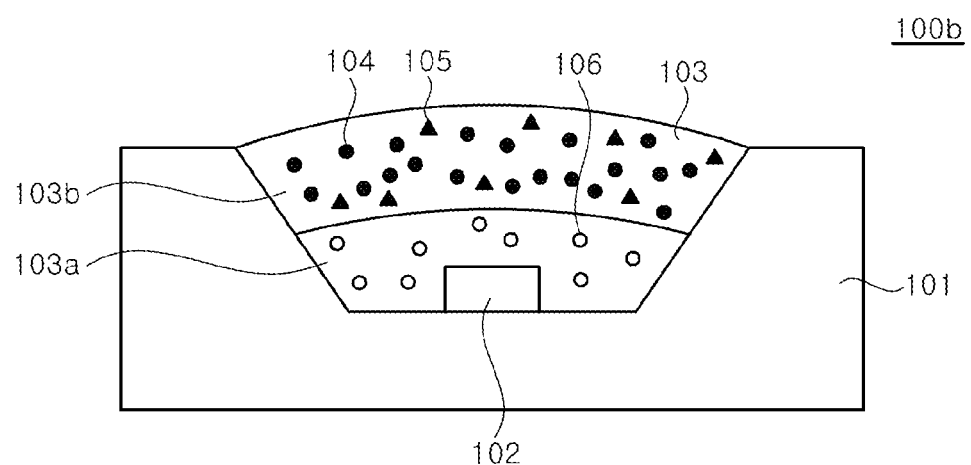
FIG. 8B is a schematic cross-sectional view illustrating a light emitting device according to another exemplary embodiment.
Figure 9:
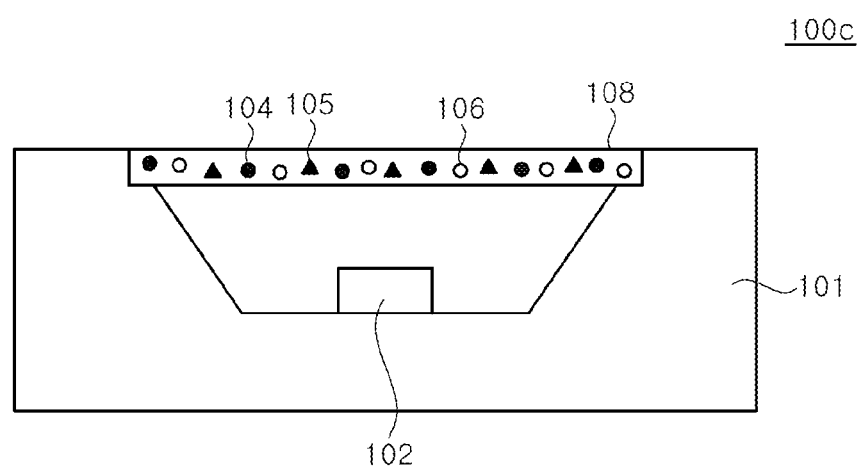
FIG. 9 is a schematic cross-sectional view illustrating a light emitting device according to another exemplary embodiment.

It is contemplated that the inventive concepts are not limited to arrangements of the phosphors 104, 105, and 106 described above. That is, the phosphors 104, 105, and 106 disposed in the first wavelength converter 103a and the second wavelength converter 103b may be variously modified. For example, FIG. 8B is a schematic cross-sectional view illustrating a light emitting device 100b according to another exemplary embodiment. Referring to FIG. 8B, a third phosphor 106 may be distributed in a first wavelength converter 103a, and a first phosphor 104 and a second phosphor 105 may be distributed in a second wavelength converter 103b. In addition, in the second wavelength converter 103b, the first phosphor 104 and the second phosphor 105 may be disposed at different densities from each other. For example, the second phosphor 105 may be disposed in the second wavelength converter 103b at a lower density than that of the first phosphor 104. The third phosphor 106 disposed in the first wavelength converter 103a may be disposed so as to be in contact with at least one surface of the light emitting diode 102 and at least one surface of a housing 101. Alternatively, the third phosphor 106 may be disposed so as to be in contact with at least one side surface and an upper surface of the light emitting diode 102. For example, the third phosphor 106 may form a layer on the side surface and the upper surface of the light emitting diode 102. In this case, a thickness of the third phosphor 106 disposed on the upper surface of the light emitting diode 102 may be greater than that of the third phosphor 106 disposed to be in contact with the side surface of the light emitting diode 102. In addition, a thickness of the third phosphor 106 disposed in contact with a bottom surface of the housing 101 may be same as or greater than that of the third phosphor 106 disposed on the upper surface of the light emitting diode 102. FIG. 9 is a schematic cross-sectional view illustrating a light emitting device 100c according to another exemplary embodiment.

Referring to FIG. 9, the light emitting device 100c includes a housing 101, a light emitting diode 102, and a wavelength converter 108, in which the wavelength converter 108 is a phosphor plate. The light emitting device 100c according to the illustrated exemplary embodiment is substantially similar to the light emitting device 100 described with reference to FIG. 6 except for a phosphor plate 108, and thus, repeated descriptions of the same components will be omitted.

The phosphor plate 108 is spaced apart from the light emitting diode 102 and disposed over the light emitting diode 102, and includes a plurality of phosphors 104, 105, and 106. A molding member may be disposed between the phosphor plate 108 and the light emitting diode 102, or an empty space may be formed instead of the molding member. The phosphor plate 108 may be formed of a material having a same hardness as that of the molding member or a material having a higher hardness, and may be formed of silicone or glass. In addition, since the phosphor plate 108 is disposed apart from the light emitting diode 102, a damage to the phosphor due to heat or light may be reduced. Accordingly, reliability of the phosphors 104, 105, and 106 may be improved.

Figure 10:
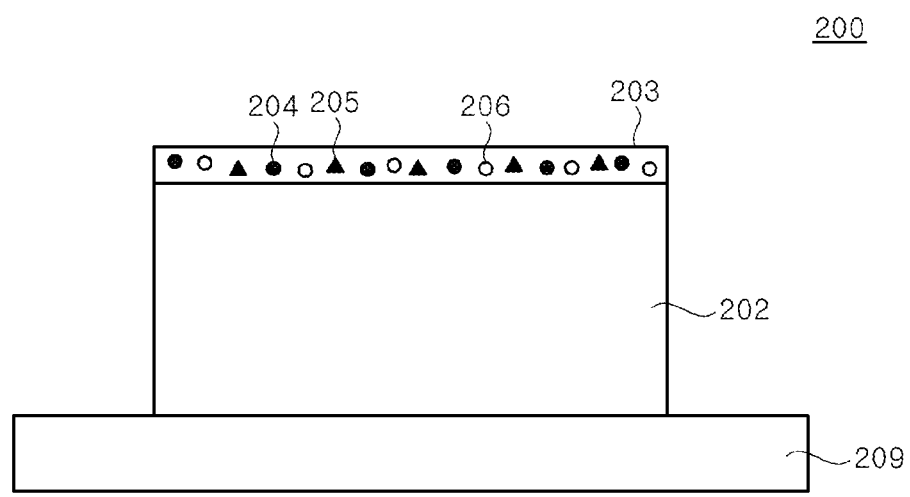
FIG. 10 is a schematic cross-sectional view illustrating a light emitting device according to another exemplary embodiment.

FIG. 10 is a schematic cross-sectional view illustrating a light emitting device 200 according to another exemplary embodiment.

Referring to FIG. 10, the light emitting device 200 includes a substrate 209, a light emitting diode 202, and a wavelength converter 203. The light emitting device 200 according to the illustrated exemplary embodiment does not include the housing 101 as described with reference to FIG. 6. The substrate 209 may be a printed circuit board electrically connected to the light emitting diode 202. The wavelength converter 203 may include a plurality of phosphors 204, 205, and 206, and may be disposed to cover an upper surface of light emitting diode 202. The wavelength converter 203 may cover a side surface of the light emitting diode 202.

Figure 11:
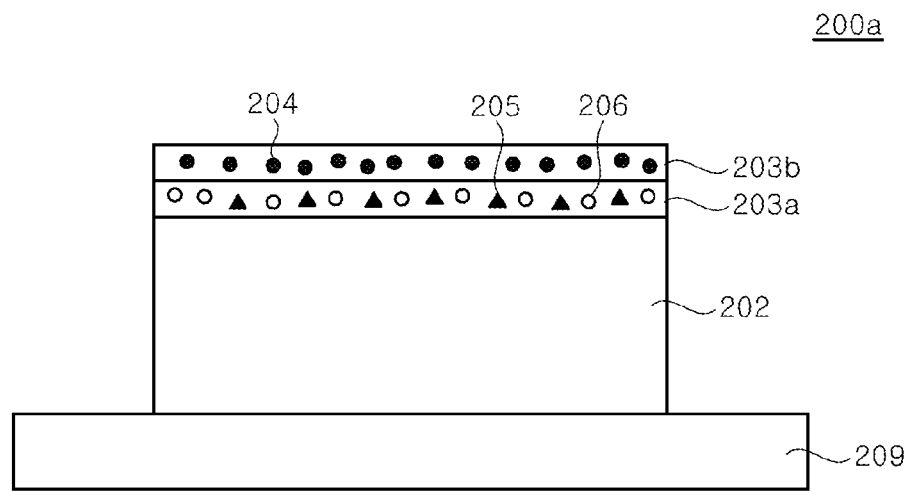
FIG. 11 is a schematic cross-sectional view illustrating a light emitting device according to another exemplary embodiment.

FIG. 11 is a schematic cross-sectional view illustrating a light emitting device 200a according to another exemplary embodiment.

Referring to FIG. 11, the light emitting device 200a includes a substrate 209, a light emitting diode 202, and wavelength converters 203a and 203b. The light emitting device 200a according to the illustrated exemplary embodiment is substantially similar to the light emitting device 200 described with reference to FIG. 10, except that the wavelength converters 203a and 203b include a first wavelength converter 203a and a second wavelength converter 203b stacked on each other.

The first wavelength converter 203a may include phosphors 205 and 206 emitting red light, and the second wavelength converter 203b may include a phosphor 204 emitting green light. By disposing a second phosphor 205 and a third phosphor 206 emitting light of a longer wavelength in a lower region, and disposing a first phosphor 204 emitting light of a shorter wavelength in an upper region, it is possible to prevent green light emitted from the first phosphor 204 from being absorbed and lost by the second phosphor 205.

In another exemplary embodiment, the first wavelength converter 203a may include the phosphor 204 emitting green light, and the second wavelength converter 203b may include the phosphors 205 and 206 emitting red light. In this case, at least one of the plurality of phosphors emitting red light, for example, the second phosphor 205, may have a low excitation efficiency by green light. Accordingly, even when the first phosphor 204 emitting green light is disposed in the lower region, green light is prevented from being absorbed by the second phosphor 205 and lost, and a stability of the red phosphor, which is vulnerable to heat, may be improved.

Figure 12:
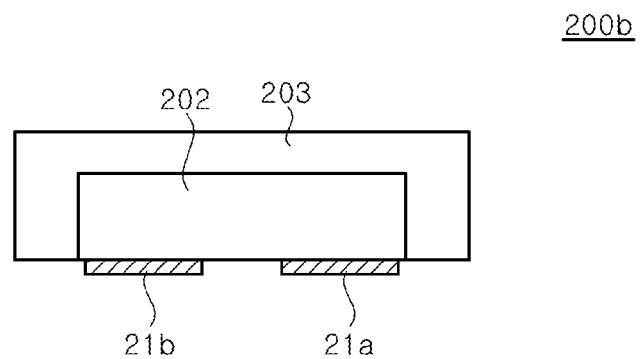
FIG. 12 is a schematic cross-sectional view illustrating a light emitting device according to another exemplary embodiment.

FIG. 12 is a schematic cross-sectional view illustrating a light emitting device 200b according to another exemplary embodiment.

Referring to FIG. 12, the light emitting device 200b includes a light emitting diode 202 and a wavelength converter 203. The light emitting device 200b according to the illustrated exemplary embodiment is substantially similar to the light emitting device 200 described with reference to FIG. 10, and the wavelength converter 203 covers an upper surface and side surfaces of the light emitting diode 202. Furthermore, the light emitting diode 202 includes bonding pads 21a and 21b, and the light emitting device 200b may be directly bonded to a circuit board or the like using the bonding pads 21a and 21b. The light emitting device 200b corresponds to a chip scale package, or the light emitting diode 202 may be a flip-type light emitting diode chip.

The wavelength converter 203 may cover the upper surface together with the side surfaces of the light emitting diode 202. The wavelength converter 203 may include the phosphors 204, 205, and 206 as described with reference to FIG. 10 or 11.

Figure 13:
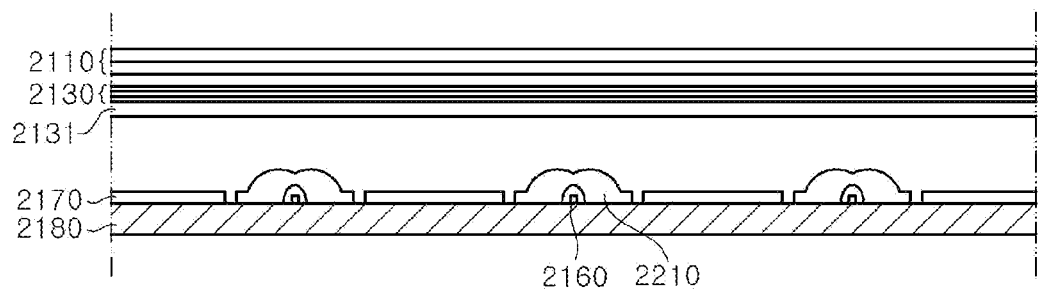
FIG. 13 is a schematic cross-sectional view illustrating a direct-type display according to an exemplary embodiment.

FIG. 13 is a schematic cross-sectional view illustrating a direct-type display according to an exemplary embodiment.

Referring to FIG. 13, the display according to an exemplary embodiment includes a display panel 2110, a backlight unit providing light to the display panel 2110, and a panel guide supporting a lower edge of the display panel 2110.

The display panel 2110 is not particularly limited, and may be, for example, a liquid crystal display panel including a liquid crystal layer. A blue pass filter blocking light other than blue light, a green pass filter blocking light other than green light, and a red pass filter blocking light other than red light may be disposed over the display panel 2110. A gate driving PCB for supplying a driving signal to a gate line may be further disposed on the edge of the display panel 2110.

Here, the gate driving PCB may be formed on a thin film transistor substrate instead of being formed on an additional PCB.

The backlight unit may include at least one substrate and a plurality of light emitting devices 2160. Furthermore, the backlight unit may further include a bottom cover 2180, a reflection sheet 2170, a diffusion plate 2131, and optical sheets 2130.

The bottom cover 2180 may be opened upward to accommodate the substrate, the light emitting device 2160, the reflection sheet 2170, the diffusion plate 2131, and the optical sheets 2130. In addition, the bottom cover 2180 may be coupled to the panel guide. The substrate is disposed under the reflection sheet 2170, and may be disposed in a form surrounded by the reflection sheet 2170. However, the inventive concepts are not limited thereto, and when a reflective material is coated on a surface thereof, it may be disposed on the reflection sheet 2170. In addition, a plurality of substrates may be formed so that the plurality of substrates is arranged in a form flush with one another, without being limited thereto, and the substrate may be formed as a single substrate.

The light emitting device 2160 may include the light emitting device according to the above-described exemplary embodiments. The light emitting devices 2160 may be regularly arranged in a predetermined pattern on the substrate. Various exemplary embodiments of the light emitting device 2160 used in the direct-type display are further described below.

In some exemplary embodiments, a lens 2210 is disposed on each of the light emitting devices 2160, which may disperse light emitted from the light emitting devices 2160. However, the lens 2210 is not necessarily required, and the lens 2210 may be omitted. For example, a light guide unit other than the lens may be included so as to increase an uniformity of light emitted from the light emitting devices 2160. The light guide unit may include, for example, a reflector, a white wall, or a molding that controls a passage of light through refractive index or a shape.

The diffusion plate 2131 and the optical sheets 2130 are disposed on the light emitting device 2160. Light emitted from the light emitting device 2160 may be supplied to the display panel 2110 in a form of a sheet light source through the diffusion plate 2131 and the optical sheets 2130.

Figure 14A:
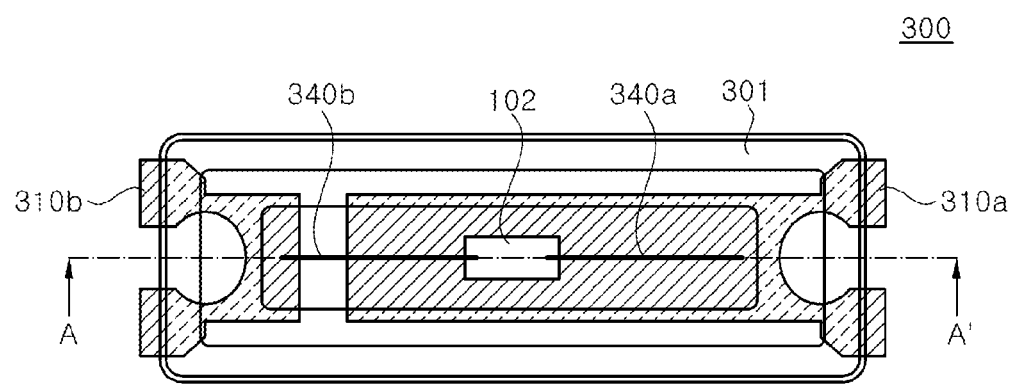
FIG. 14A is a schematic plan view illustrating a top-view light emitting device according to an exemplary embodiment.
Figure 14B:
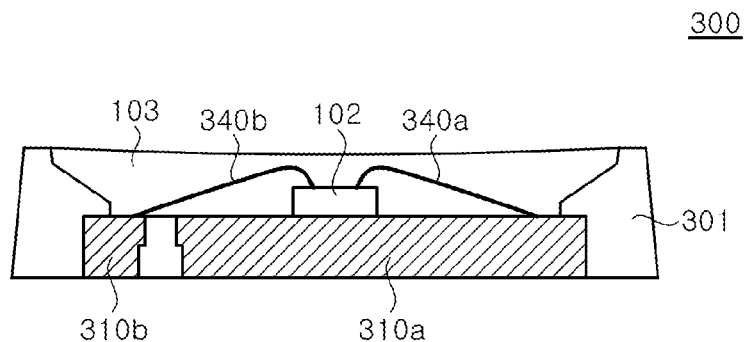
FIG. 14B is a schematic cross-sectional view taken along line A-A' of FIG. 14A.

FIG. 14A and FIG. 14B are a schematic plan view and a cross-sectional view illustrating a top-view light emitting device 300 according to an exemplary embodiment.

Referring to FIG. 14A and FIG. 14B, the light emitting device 300 may include a light emitting diode 102, a wavelength converter 103, a first lead 310*a* and a second lead 310*b*, a housing 301, and bonding wires 340*a* and 340*b*.

The housing 301 covers portions of upper surfaces and side surfaces of the first and second leads 310*a* and 310*b*. Lower surfaces of the first and second leads 310*a* and 310*b* are exposed to a bottom surface of the housing 301, and end portions of the first and second leads 310*a* and 310*b* are exposed to a side surface of the housing 301 to be connected to an external power source.

The housing 301 may also fill a region between the first lead 310*a* and the second lead 310*b*. The first and second leads 310*a* and 310*b* may be half-cut at bottom surfaces thereof, and thus, stepped portions may be formed in the region between the first lead 310*a* and the second lead 310*b*. The stepped portions prevent the first and second leads 310*a* and 310*b* from being separated from the housing 301 to provide a package having a robust structure.

Furthermore, each of the first and second leads 310*a* and 310*b* includes at least two end portions extended from a main body disposed inside the housing 301, and these end portions are branched in the housing 301 and extend from the side surface of the housing 301 to the outside. Accordingly, it is possible to prevent the first and second leads 310*a* and 310*b* from being separated from the housing 301.

The housing 301 may be formed of a reflective material capable of reflecting light emitted from the light emitting diode 102 and phosphors, and may be formed of, for example, a white epoxy molding compound (EMC).

The housing 301 may be formed to have a cavity for accommodating the light emitting diode 102 and the wavelength converter 103. In addition, an inner wall of the housing 301 forming the cavity may form an inclined surface, and stepped portions may be formed at an upper end and a lower end of the inclined surface. An outer wall of the housing 301 may be vertical, without being limited thereto, and may be inclined to form an acute angle with the bottom surfaces of the first and second leads 310*a* and 310*b* as shown in FIG. 14B.

The light emitting diode 102 is mounted on the first lead 310*a*, and is electrically connected to the first and second leads 310*a* and 310*b* through the bonding wires 340*a* and 340*b*. The wavelength converter 103 is disposed in the cavity of the housing 301 to cover the light emitting diode 102. The wavelength converter 103 may include at least one of phosphors 104, 105, and 106 as described above.

Since the light emitting diode 102 and the wavelength converter 103 are same as those described with reference to FIG. 6, 8A, 8B, or 9, detailed descriptions thereof will be omitted. The light emitting diode 102 according to the illustrated exemplary embodiment is shown as a lateral-type light emitting diode chip. However, the inventive concepts are not limited thereto, and the light emitting diode 102 may be a vertical-type light emitting diode chip or a flip-type light emitting diode chip in some exemplary embodiments.

Figure 15:
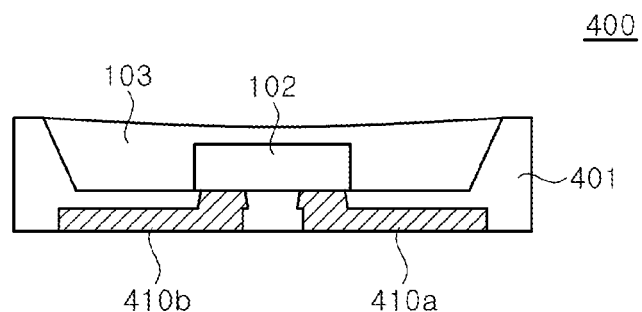
FIG. 15 is a schematic cross-sectional view illustrating a light emitting device according to another exemplary embodiment.

FIG. 15 is a schematic cross-sectional view illustrating a light emitting device 400 according to another exemplary embodiment.

Referring to FIG. 15, the light emitting device 400 according to the illustrated exemplary embodiment may include a light emitting diode 102, a wavelength converter 103, first and second leads 410*a* and 410*b*, and a housing 401.

The first and second leads 410*a* and 410*b* may have protrusions for mounting the light emitting diode 102 through half-cutting on upper surfaces thereof. The protrusions may be formed close to adjacent side surfaces of the first and second leads 410*a* and 410*b*.

In addition, the first and second leads 410*a* and 410*b* may have stepped portions for fastening the housing 401 through half-cutting on lower surfaces thereof. As shown in FIG. the stepped portions may be formed on side surfaces of the first lead 410*a* and the second lead 410*b* facing each other.

The housing 401 covers the side surfaces and the upper surfaces of the first and second leads 410*a* and 410*b*, but exposes the protrusions. The housing 401 may be formed of a highly reflective material, for example, white epoxy molding compound (EMC), so as to reflect light emitted from the light emitting diode 102 and phosphors.

The light emitting diode 102 may be flip-bonded on the protrusions of the first and second leads 410*a* and 410*b*, and the wavelength converter 103 may be disposed in a cavity of the housing 401 to cover the light emitting diode 102. The wavelength converter 103 may include at least one of the phosphors 104, 105, and 106 as described with reference to FIG. 14A and FIG. 14B. In the illustrated exemplary embodiment, the light emitting diode 102 may be a flip-type light emitting diode chip.

Figure 16:
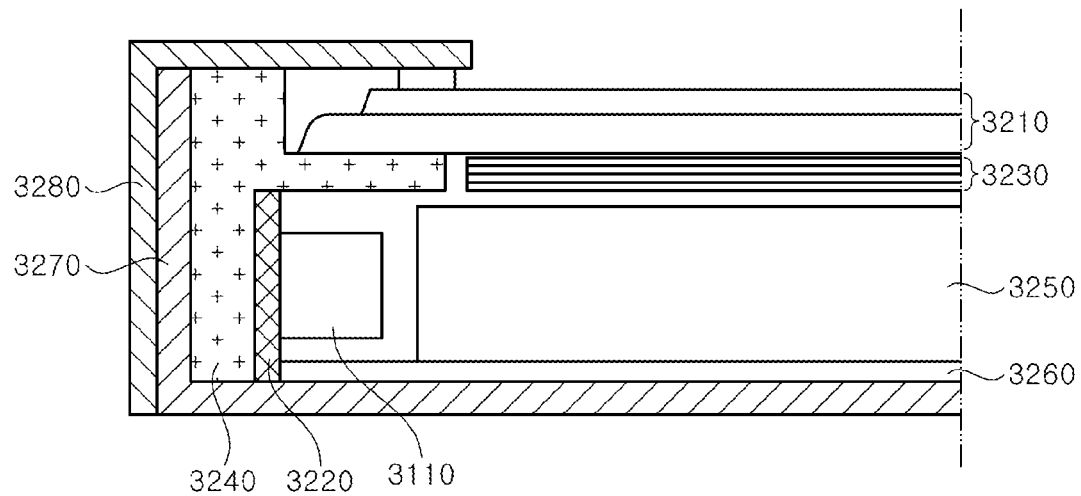
FIG. 16 is a schematic cross-sectional view illustrating an edge-type display according to another exemplary embodiment.

FIG. 16 is a schematic cross-sectional view illustrating an edge-type display according to another exemplary embodiment.

Referring to FIG. 16, the display according to the illustrated exemplary embodiment includes a display panel 3210 and a backlight unit disposed on a rear surface of the display panel 3210 to irradiate light. Furthermore, the display includes a frame 3240 supporting the display panel 3210 and accommodating the backlight unit and covers 3270 and 3280 surrounding the display panel 3210.

The display panel 3210 is not particularly limited, and may be, for example, a liquid crystal display panel including a liquid crystal layer. A blue pass filter blocking light other than blue light, a green pass filter blocking light other than green light, and a red pass filter blocking light other than red light may be disposed over the display panel 3210. A gate driving PCB for supplying a driving signal to a gate line may be further disposed on an edge of the display panel 3210. Here, the gate driving PCB may be formed on a thin film transistor substrate instead of being formed on an additional PCB. The display panel 3210 is fixed by the covers 3270 and 3280 disposed under and over the display panel 3210, and the cover 3270 disposed under the display panel 3210 may be coupled to the backlight unit.

The backlight unit for providing light to the display panel 3210 includes a lower cover 3270 having a partially opened upper surface, a light source module disposed on one inner side of the lower cover 3270, and a light guide plate 3250 disposed in parallel with the light source module to convert point light into surface light. In addition, the backlight unit of the illustrated exemplary embodiment may further include optical sheets 3230 disposed on the light guide plate 3250 to diffuse and condense light, and a reflection sheet 3260 disposed under the light guide plate 3250 to reflect light progressing in a lower direction of the light guide plate 3250 toward the display panel 3210.

The light source module includes a substrate 3220 and a plurality of light emitting devices 3110 disposed apart from one another at regular intervals on one surface of the substrate 3220. The substrate 3220 is not limited as long as it supports the light emitting device 3110 and electrically connected to the light emitting device 3110, and may be, for example, a printed circuit board. The light emitting device 3110 may include the light emitting diodes 102 and 202 and at least one of the phosphors 104, 105 and 106 according to the above-described exemplary embodiments. Light emitted from the light source module is incident on the light guide plate 3250 and is supplied to the display panel 3210 through the optical sheets 3230. Through the light guide plate 3250 and the optical sheets 3230, point light emitted from the light emitting devices 3110 may be transformed into surface light. The light emitting device 3110 may also be a side-view light emitting device, which will be described in detail with reference to FIG. 17.

Figure 17:
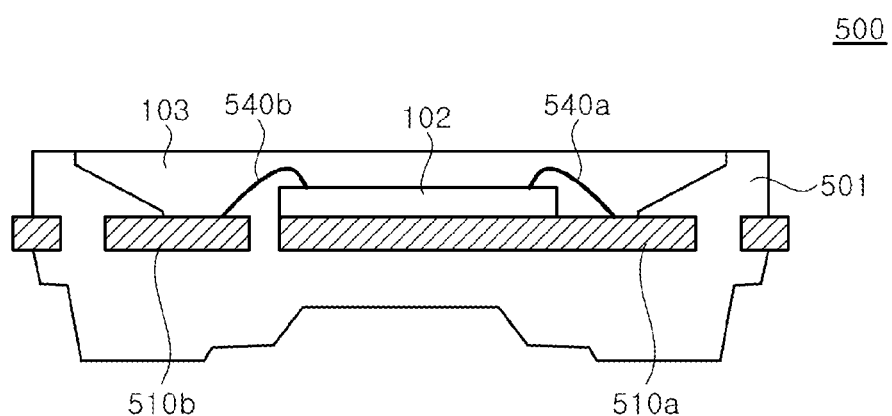
FIG. 17 is a schematic cross-sectional view illustrating a side-view light emitting device according to an exemplary embodiment.

FIG. 17 is a schematic cross-sectional view illustrating a side-view light emitting device 500 according to an exemplary embodiment.

Referring to FIG. 17, the light emitting device 500 may include a light emitting diode 102, a wavelength converter 103, first and second leads 510a and 510b, a housing 501, bonding wires 540a and 540b.

The housing 501 surrounds the first and second leads 510a and 510b, and has a cavity. Upper surfaces of the first and second leads 510a and 510b are exposed in the cavity of the housing 501.

The first and second leads 510a and 510b extend from a side surface of the housing 501 and are bent toward a rear surface of the housing 501. The first and second leads 510a and 510b formed on the rear surface are mounted on a circuit board, and thus, the light emitting device 500 may emit light in a lateral direction from the circuit board on which it is mounted.

The light emitting diode 102 may be mounted on the first lead 510a, and may be electrically connected to the first and second leads 510a and 510b through the bonding wires 540a and 540b. The light emitting diode 102 may be of a lateral type, but the inventive concepts are not limited thereto.

The wavelength converter 103 is disposed in the cavity of the housing 501 to cover the light emitting diode chip 102. The wavelength converter 103 may include at least one of the phosphors 104, 105, and 106 described in the previous exemplary embodiments.

Figure 18:
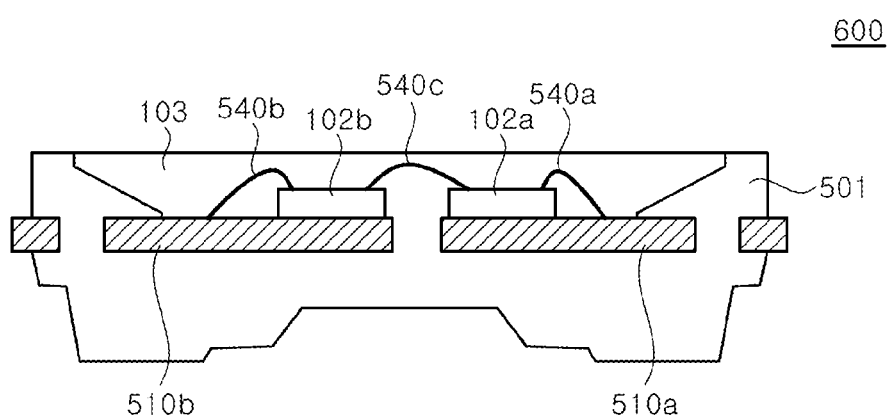
FIG. 18 is a schematic cross-sectional view illustrating a side-view light emitting device according to another exemplary embodiment.

FIG. 18 is a schematic cross-sectional view illustrating a side-view light emitting device 600 according to another exemplary embodiment.

Referring to FIG. 18, the light emitting device 600 according to the illustrated exemplary embodiment is substantially similar to the light emitting device 500 described with reference to FIG. 17, except that two light emitting diodes 102a and 102b are mounted on a first lead 510a and a second lead 510b, respectively.

The light emitting diodes 102a and 102b may be connected in series to the first and second leads 510a and 510b through bonding wires 540a, 540b, and 540c.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

We claim:

1. A compound of the general formula (I):

$$A_3BF_2M_{1-x}T_xO_{2-2x}F_{4+2x} \quad (I)$$

doped with Mn(IV), wherein:
A is selected from the group consisting of Li, Na, K, Rb, Cs, Cu, Ag, Tl, NH$_4$, NR$_4$ and mixtures of two or more thereof, where R is an alkyl or aryl group;
B is selected from the group consisting of H and D and mixtures thereof, where D is Deuterium;
M is selected from the group consisting of Cr, Mo, W, Te, Re and mixtures of two or more thereof;
T is selected from the group consisting of Si, Ge, Sn, Ti, Pb, Ce, Zr, Hf and mixtures of two or more thereof; and
0<x≤1.

2. The compound according to claim 1, wherein the index x is in a range of 0.1 and 0.9.

3. The compound according to claim 1, wherein:
A is selected from the group consisting of Na, K, Cs and mixtures of two or three thereof;
M is selected from the group consisting of Mo, W and mixtures of Mo and W, where Cr, Te and/or Re may optionally be present;
T is selected from the group consisting of Si, Ti and mixtures of Si and Ti, where Ge, Sn, Pb, Ce, Zr, and/or Hf may optionally be present; and
0.0001<x≤0.40.

4. A compound of the general formula (I):

$$A_3BF_2M_{1-x}T_xO_{2-2x}F_{4+2x} \quad (I)$$

doped with Mn(IV), wherein:
A is selected from the group consisting of Li, Na, K, Rb, Cs, Cu, Ag, Tl, $NH_4$, $NR_4$ and mixtures of two or more thereof, where R is an alkyl or aryl group;
B is selected from the group consisting of H and D and mixtures thereof, where D is Deuterium;
M is selected from the group consisting of Cr, Mo, W, Te, Re and mixtures of two or more thereof;
T is selected from the group consisting of Si, Ge, Sn, Ti, Pb, Ce, Zr, Hf and mixtures of two or more thereof;
$0 \leq x \leq 1$; and
a surface of the compound is coated another compound.

5. A process for preparing the compound of claim 1, comprising the steps of:
a) preparing a solution/suspension comprising A, B, M, T and Mn in an AF-containing solution;
b) stirring the suspension/solution; and
c) removing the solid obtained.

6. A luminophore or conversion luminophore configured to partially or completely convert UV light, violet light and/or blue light to light of a longer wavelength, the luminophore or conversion luminophore comprising the compound of claim 1.

7. A radiation-converting mixture comprising the compound of claim 1.

8. The radiation-converting mixture according to claim 7, further comprising one or more further luminescent materials selected from conversion luminophores and semiconductor nanoparticles.

9. A light source comprising at least one primary light source and at least one compound of claim 1.

10. The light source according to claim 9, wherein the at least one primary light source comprises a luminescent indium aluminum gallium nitride.

11. The light source according to claim 10, wherein the luminescent indium aluminum gallium nitride is a compound of the formula $In_iGa_jAl_kN$, where $0 \leq i$, $0 \leq j$, $0 \leq k$ and $i+j+k=1$.

12. A lighting unit comprising at least one light source of claim 9.

13. A light emitting device, comprising:
a substrate;
a light emitting diode disposed on the substrate; and
a wavelength converter disposed on the substrate, wherein:
the wavelength converter includes a plurality of phosphors, and white light is formed by mixing light emitted from the light emitting diode and each of the plurality of phosphors; and
at least one of the plurality of phosphors is an Mn(IV)-activated luminescent material based on an oxidohalide host lattice; and
the wavelength converter includes a first wavelength converter and a second wavelength converter stacked one over another.

14. The light emitting device of claim 13, wherein the at least one of the plurality of phosphors is configured to emit light in a same color range as that of the Mn(IV)-activated luminescent material based on the oxidohalide host lattice.

15. The light emitting device of claim 13, wherein the at least one of the plurality of phosphors is configured to emit light in a different color range from that of the Mn(IV)-activated luminescent material based on the oxidohalide host lattice.

16. The light emitting device of claim 13, wherein white light formed by mixing light emitted from the light emitting diode and each of the plurality of phosphors has a CRI of 90 or higher.

17. The light emitting device of claim 13, wherein white light formed by mixing light emitted from the light emitting diode and each of the plurality of phosphors has a luminous efficiency exceeding 100%.

18. The light emitting device of claim 13, wherein the wavelength converter is spaced apart from the light emitting diode.

* * * * *